United States Patent
Shishido et al.

(10) Patent No.: US 8,749,930 B2
(45) Date of Patent: Jun. 10, 2014

(54) PROTECTION CIRCUIT, SEMICONDUCTOR DEVICE, PHOTOELECTRIC CONVERSION DEVICE, AND ELECTRONIC DEVICE

(75) Inventors: Hideaki Shishido, Kanagawa (JP); Osamu Fukuoka, Aichi (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 658 days.

(21) Appl. No.: 12/693,905

(22) Filed: Jan. 26, 2010

(65) Prior Publication Data
US 2010/0202090 A1  Aug. 12, 2010

(30) Foreign Application Priority Data

Feb. 9, 2009 (JP) ................................ 2009-027573

(51) Int. Cl.
*H02H 9/00* (2006.01)
(52) U.S. Cl.
USPC ......................................................... 361/56
(58) Field of Classification Search
USPC ......................................................... 361/56
See application file for complete search history.

(56) References Cited

U.S. PATENT DOCUMENTS

| | | | |
|---|---|---|---|
| 4,989,057 A | 1/1991 | Lu | |
| 5,617,283 A * | 4/1997 | Krakauer et al. | 361/56 |
| 5,731,856 A | 3/1998 | Kim et al. | |
| 5,744,864 A | 4/1998 | Cillessen et al. | |
| 6,285,536 B1 * | 9/2001 | Holberg et al. | 361/56 |
| 6,294,274 B1 | 9/2001 | Kawazoe et al. | |
| 6,483,365 B2 | 11/2002 | Morishita | |
| 6,563,174 B2 | 5/2003 | Kawasaki et al. | |
| 6,671,146 B1 | 12/2003 | Hashimoto et al. | |
| 6,727,522 B1 | 4/2004 | Kawasaki et al. | |
| 6,791,125 B2 * | 9/2004 | Demkov et al. | 257/192 |
| 6,844,596 B2 | 1/2005 | Ohnakado | |
| 6,952,037 B2 | 10/2005 | Ishikawa et al. | |

(Continued)

FOREIGN PATENT DOCUMENTS

| | | |
|---|---|---|
| EP | 1 619 725 A2 | 1/2006 |
| EP | 1 737 044 A1 | 12/2006 |

(Continued)

OTHER PUBLICATIONS

Fortunato.E et al., "Wide-Bandgap High-Mobility ZnO Thin-Film Transistors Produced at Room Temperature,", Appl. Phys. Lett. ( Applied Physics Letters), Sep. 27, 2004, vol. 85, No. 13, pp. 2541-2543.

(Continued)

*Primary Examiner* — Ronald W Leja
(74) *Attorney, Agent, or Firm* — Nixon Peabody LLP; Jeffrey L. Costellia

(57) ABSTRACT

It is an object to provide a protection circuit and a semiconductor device to which a countermeasure against ESD is applied. The protection circuit includes a signal line electrically connected to an integrated circuit; a first diode provided between the signal line and a first power supply line; a second diode provided in parallel to the first diode; and a third diode provided between the first power supply line and a second power supply line. The first diode is a diode formed by diode-connecting a transistor, and the second diode is a diode having a PIN junction or a PN junction. The protection circuit is particularly effective when applied to a semiconductor device manufactured using a thin film transistor.

18 Claims, 17 Drawing Sheets

(56) References Cited

U.S. PATENT DOCUMENTS

| | | | |
|---|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,174,047 B2 | 5/2012 | Fukuoka et al. |
| 8,237,351 B2 * | 8/2012 | Sung et al. ............... 313/503 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0070901 A1 | 4/2004 | Umeda |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0264963 A1 * | 12/2005 | Sato ............... 361/56 |
| 2006/0017139 A1 | 1/2006 | Eguchi et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0261413 A1 * | 11/2006 | Yamada et al. ............ 257/355 |
| 2006/0268479 A1 * | 11/2006 | Bischof ............ 361/56 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0058307 A1 * | 3/2007 | Mergens et al. ............ 361/56 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0267701 A1 * | 11/2007 | Sung et al. ............ 257/365 |
| 2007/0272922 A1 | 11/2007 | Kim et al. |
| 2007/0287296 A1 | 12/2007 | Chang |
| 2007/0296660 A1 * | 12/2007 | Kimura et al. ............ 345/87 |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0239599 A1 * | 10/2008 | Yizraeli et al. ............... 361/56 |
| 2008/0253044 A1 * | 10/2008 | Okushima ............ 361/56 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236496 A1 | 9/2009 | Tanada et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134708 A1 * | 6/2010 | Kimura et al. ............... 349/38 |
| 2012/0019968 A1 * | 1/2012 | Hsieh et al. ............... 361/56 |
| 2012/0050927 A1 * | 3/2012 | Okushima ............ 361/56 |
| 2012/0211749 A1 | 8/2012 | Fukuoka et al. |

FOREIGN PATENT DOCUMENTS

| | | |
|---|---|---|
| EP | 2 226 847 A2 | 9/2010 |
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-102411 | 4/1993 |
| JP | 05-251642 | 9/1993 |
| JP | 05-251705 | 9/1993 |
| JP | 05-335494 | 12/1993 |
| JP | 06-029567 | 2/1994 |
| JP | 08-264794 | 10/1996 |
| JP | 11-000008 | 1/1999 |
| JP | 11-505377 | 5/1999 |
| JP | 2000-044236 | 2/2000 |
| JP | 2000-150900 | 5/2000 |
| JP | 2002050698 A * | 2/2002 |
| JP | 2002-076356 | 3/2002 |
| JP | 2002-100761 | 4/2002 |
| JP | 2002-289859 | 10/2002 |
| JP | 2003-086000 | 3/2003 |
| JP | 2003-086808 | 3/2003 |
| JP | 2004-087765 | 3/2004 |
| JP | 2004-103957 | 4/2004 |
| JP | 2004-128052 A | 4/2004 |
| JP | 2004-273614 | 9/2004 |
| JP | 2004-273732 | 9/2004 |
| JP | 2006-060191 | 3/2006 |
| JP | 2006-319180 | 11/2006 |
| WO | WO 00/44049 A1 | 7/2000 |
| WO | WO-2004/114391 A1 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04, SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector with Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Paper, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. ( Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m < 4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

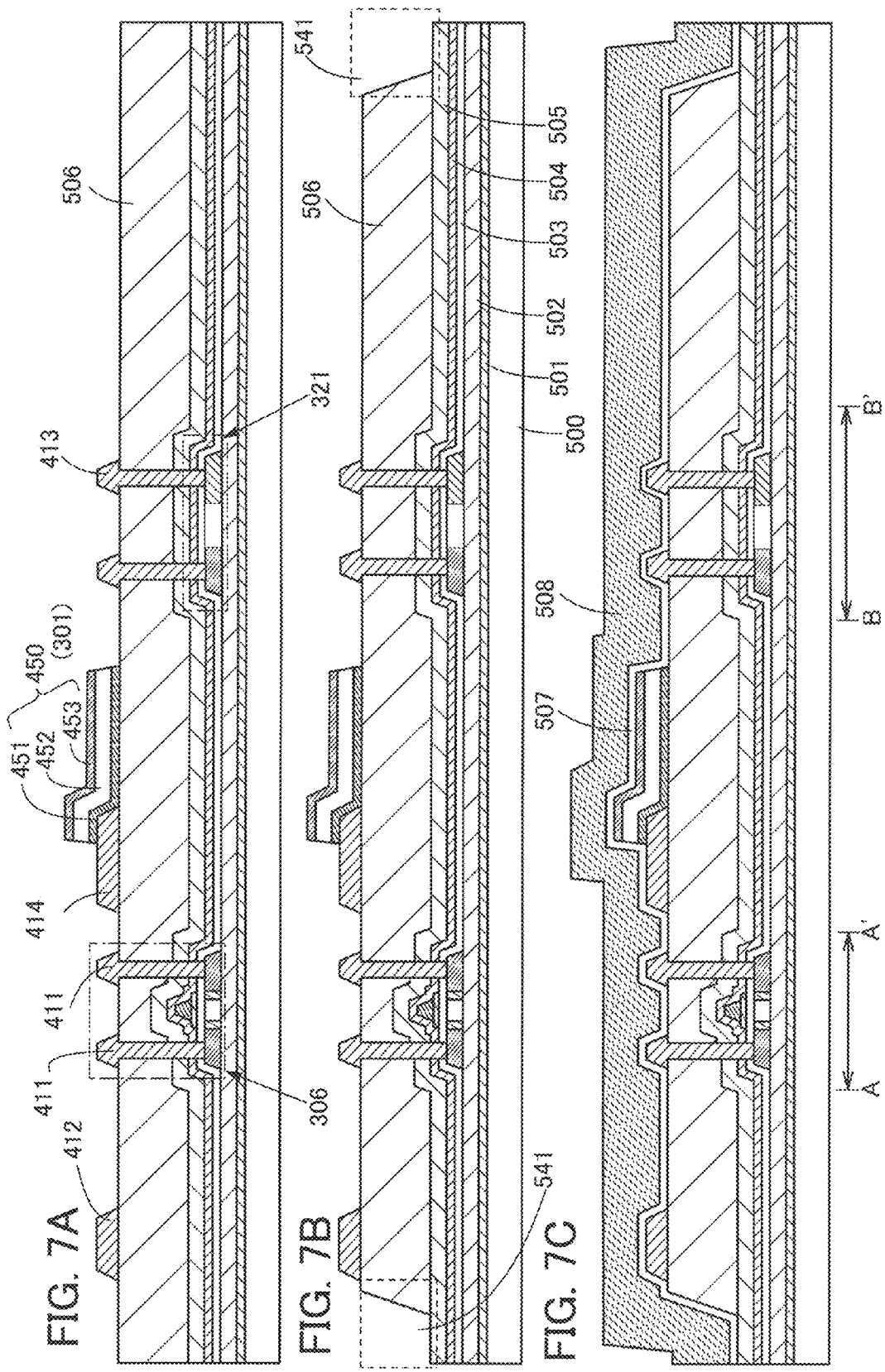

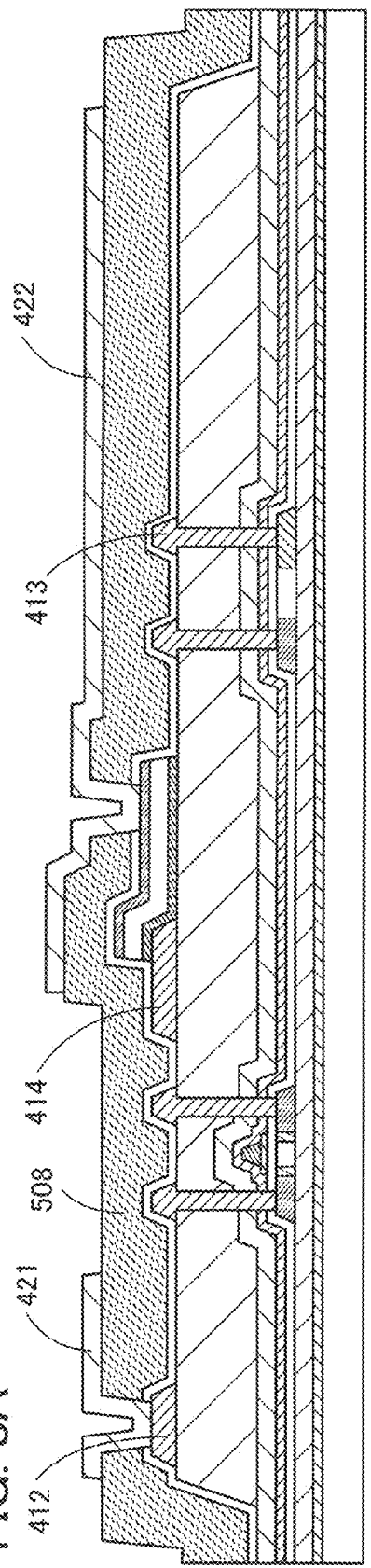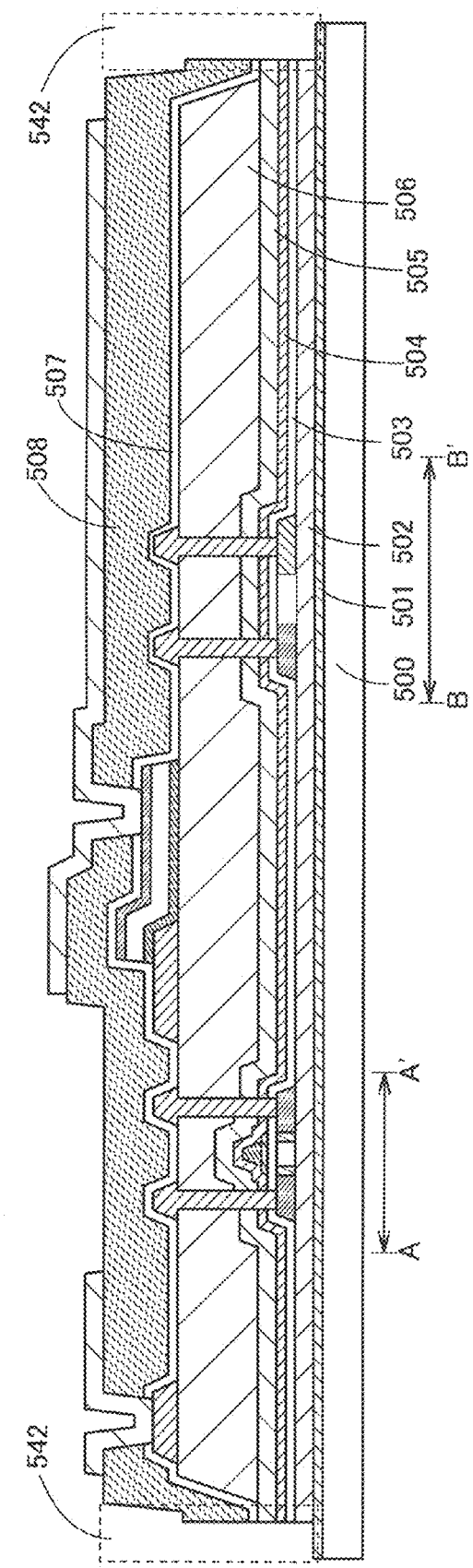

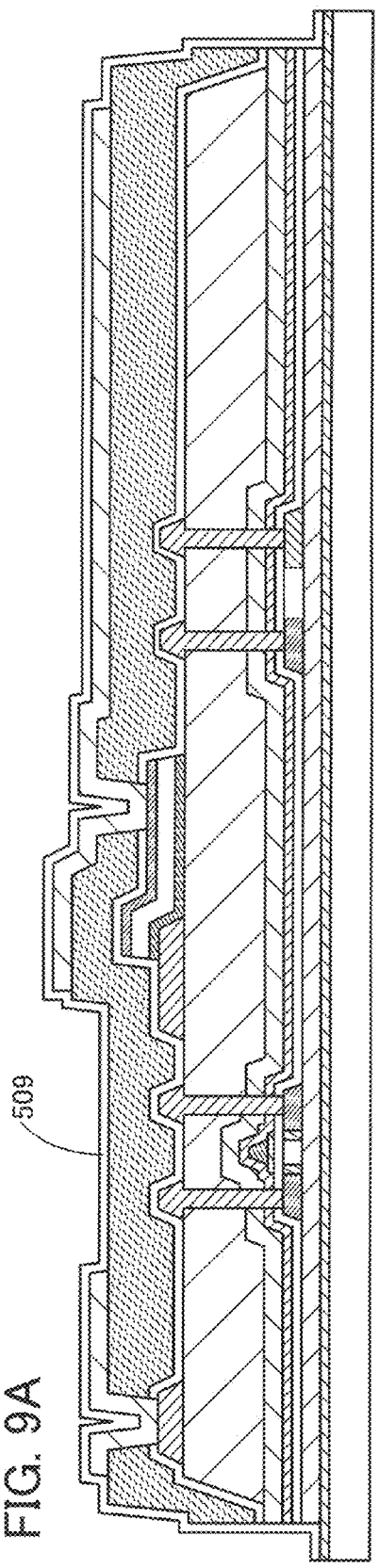
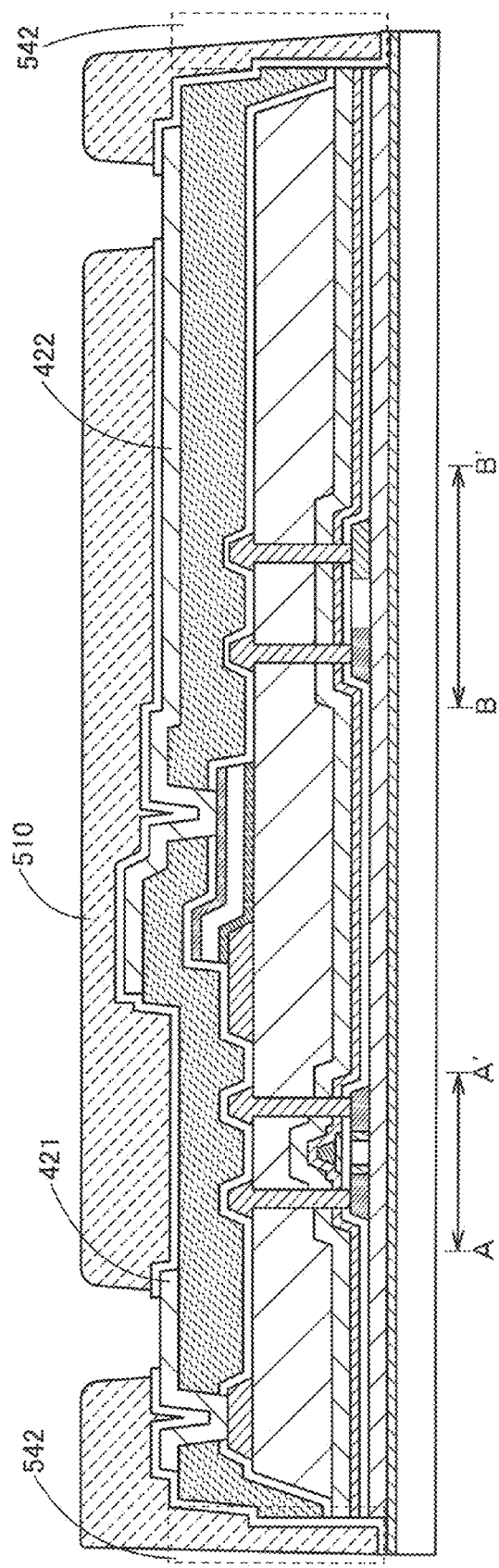
FIG. 9A
FIG. 9B

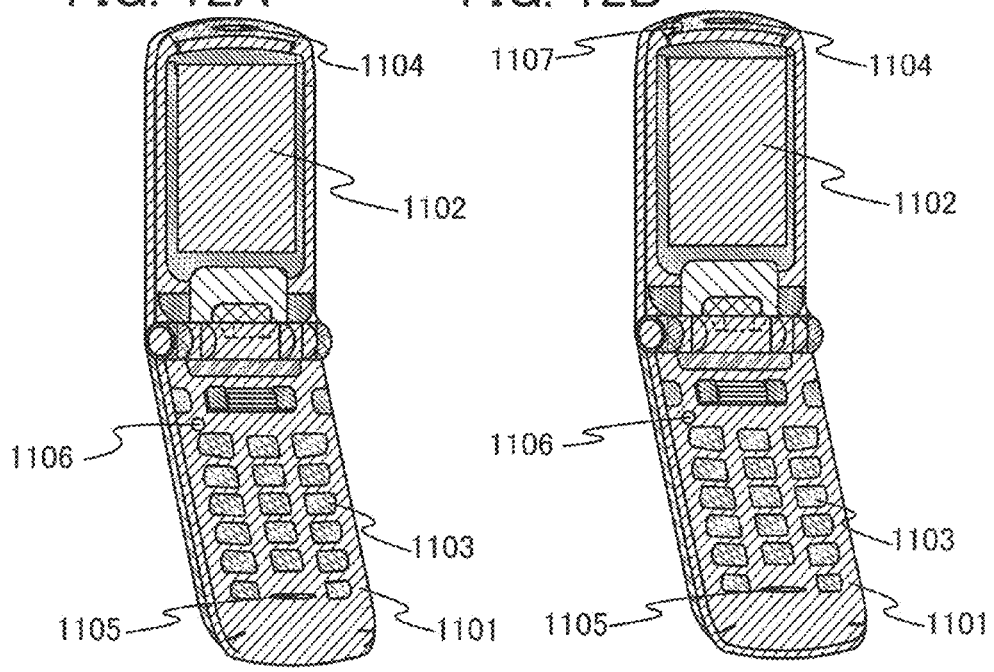
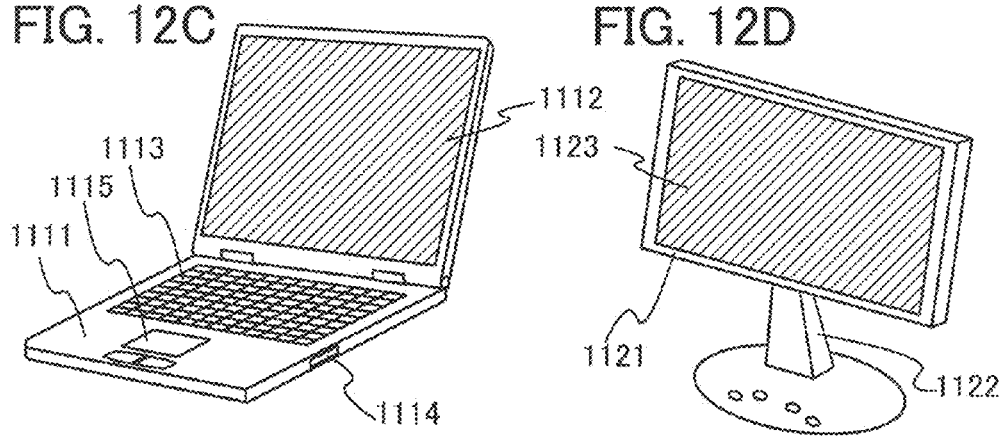
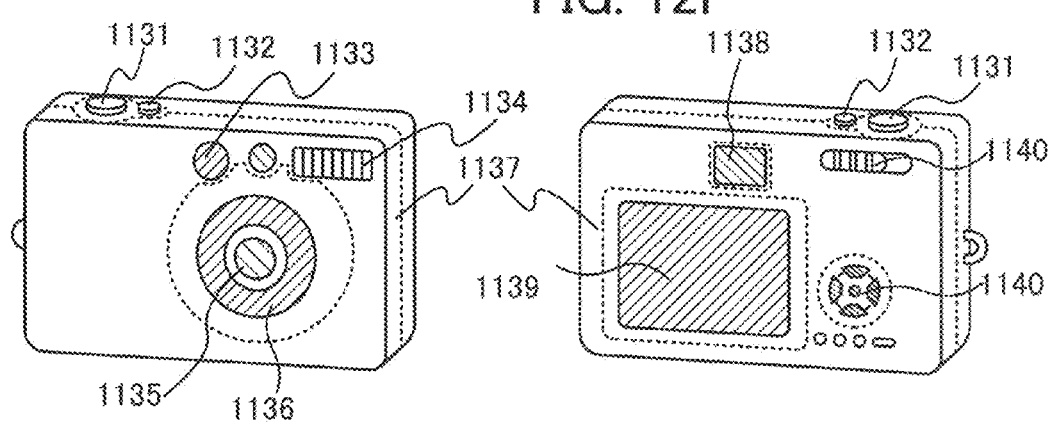

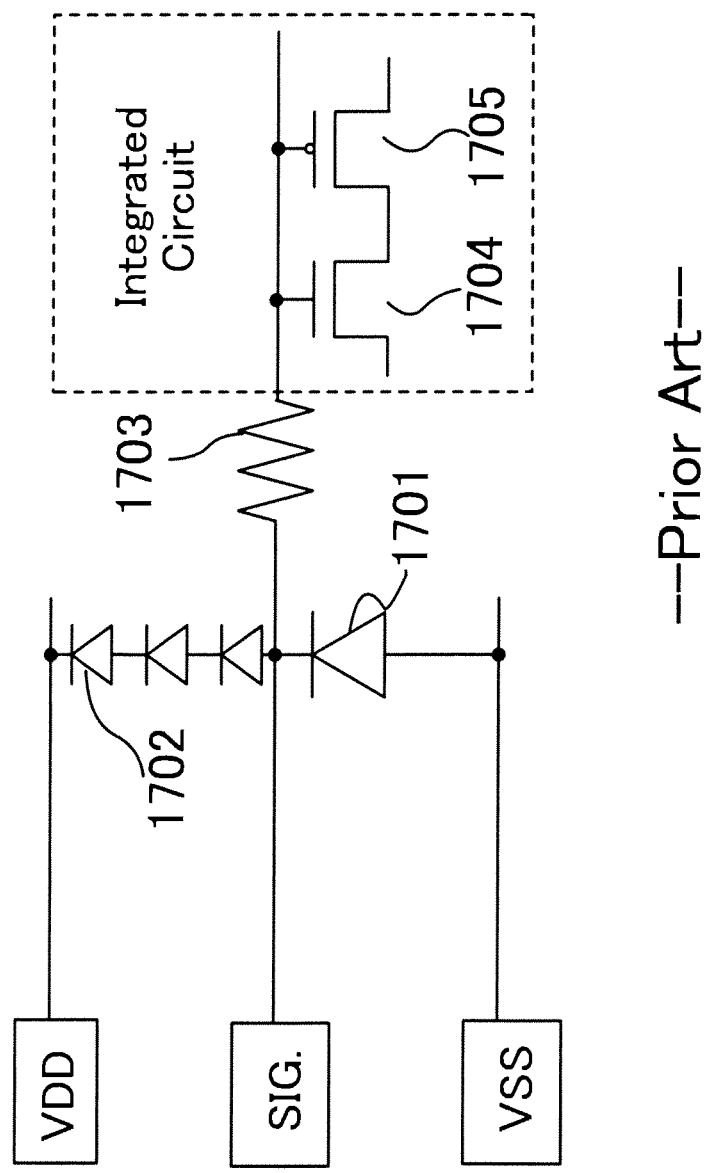
FIG. 17 —Prior Art—

PROTECTION CIRCUIT, SEMICONDUCTOR DEVICE, PHOTOELECTRIC CONVERSION DEVICE, AND ELECTRONIC DEVICE

BACKGROUND OF THE INVENTION

1. Field of the Invention

The present invention relates to a protection circuit.

2. Description of the Related Art

One of major causes of defects in an integrated circuit is damage to a semiconductor element, an electrode, or the like due to electrostatic discharge (hereinafter referred to as ESD). Thus, in order to prevent an integrated circuit from being damaged due to ESD, a protection circuit is provided between a terminal and the integrated circuit. A protection circuit refers to a circuit for preventing overvoltage applied to a terminal due to ESD or the like from being supplied to an integrated circuit.

As for a protection circuit of a signal line, a technique for preventing overcurrent from flowing into an integrated circuit when a signal line terminal has a potential between that of a high potential power supply terminal (VDD) and that of a low potential power supply terminal (VSS) is disclosed in Patent Document 1.

REFERENCE

[Patent Document 1] Japanese Published Patent Application No. 2006-60191

SUMMARY OF THE INVENTION

However, in the case where the above signal line protection circuit of Patent Document 1 is employed and diodes in the protection circuit are provided between a signal line terminal (a SIG. terminal) and a high potential power supply terminal (a VDD terminal) and between the SIG. terminal and a low potential power supply terminal (a VSS terminal), the following problem may be caused: when an operation in which a signal potential that is input to SIG. is higher than or equal to a VDD potential or lower than or equal to a VSS potential is performed, either of the diodes is forward-biased; accordingly, current flows and the signal potential becomes equal to the VSS potential or the VDD potential.

As an example of a counter measure against the problem, the following method can be given: as illustrated in FIG. 17, a protection circuit is formed in such a manner that a plurality of diodes is connected in series on the side to which a forward bias is applied in accordance with a signal potential, so that a forward bias higher than threshold voltage is applied to none of the plurality of diodes connected in series even when a signal potential that is input to SIG is higher than a VDD potential. However, the area occupied by the protection circuit is increased.

In particular, in the case where the protection circuit is manufactured using a thin film semiconductor, the protection circuit includes a Si resistor 1703 connected in series, a lateral PIN junction diode 1701 connected in parallel (between SIG. and VSS), and a plurality of lateral PIN junction diodes 1702 connected in parallel (between SIG. and VDD). However, the number of stages is changed in order to adjust the threshold in accordance with the potential difference between SIG. and VDD. In addition, since a lateral junction diode has a large area, the size of the circuit is considerably increased.

In the view of the foregoing problems, it is an object of one mode of the present invention to provide an adequate protection circuit without increasing the circuit size.

In order to achieve the above object, a protection circuit according to one mode of the present invention includes a signal line electrically connected to an integrated circuit; a first diode provided between the signal line and a first power supply line; a second diode provided in parallel to the first diode; and a third diode provided between the first power supply line and a second power supply line, wherein the first diode is a diode formed by diode-connecting a transistor and wherein the second diode is a diode having a PIN junction or a PN junction.

In addition to the above configuration, a transistor forming the first diode is a transistor that is formed at the same time as at least one of transistors included in the integrated circuit.

In addition to the above configuration, the second diode is a lateral junction diode having the PIN junction or the PN junction which is formed by adding an impurity imparting p-type conductivity and an impurity imparting n-type conductivity to a semiconductor layer, and the semiconductor layer is a semiconductor layer formed at the same time as a semiconductor layer of the transistor.

In addition to the above configuration, the signal line includes a resistor that is provided in series in any path which is electrically connected to the integrated circuit.

The protection circuit according to one mode of the present invention is used for a semiconductor device.

The semiconductor device according to one mode of the present invention is used for a photoelectric conversion device.

The semiconductor device or the photoelectric conversion device according to one mode of the present invention is used for an electronic device.

With the structure of the protection circuit which is one mode of the present invention, a protection circuit which has high performance of suppressing increase in the ESD potential can be obtained. In addition, a highly reliable semiconductor device, a highly reliable photoelectric conversion device, and a highly reliable electronic device can be obtained.

BRIEF DESCRIPTION OF THE DRAWINGS

In the accompanying drawings:

FIGS. 7A to 7C are views illustrating one mode of Embodiment 5;

FIGS. 8A and 8B are views illustrating one mode of Embodiment 5;

FIGS. 9A and 9B are views illustrating one mode of Embodiment 5;

FIGS. 12A to 12F are views each illustrating one mode of Embodiment 6;

FIG. 17 is a diagram illustrating an example of a conventional art.

DETAILED DESCRIPTION OF THE INVENTION

Embodiment 1

An embodiment of the present invention will be described below. Here, a protection circuit according to one mode of the present invention is applied to an integrated circuit using a semiconductor.

Figure 1:
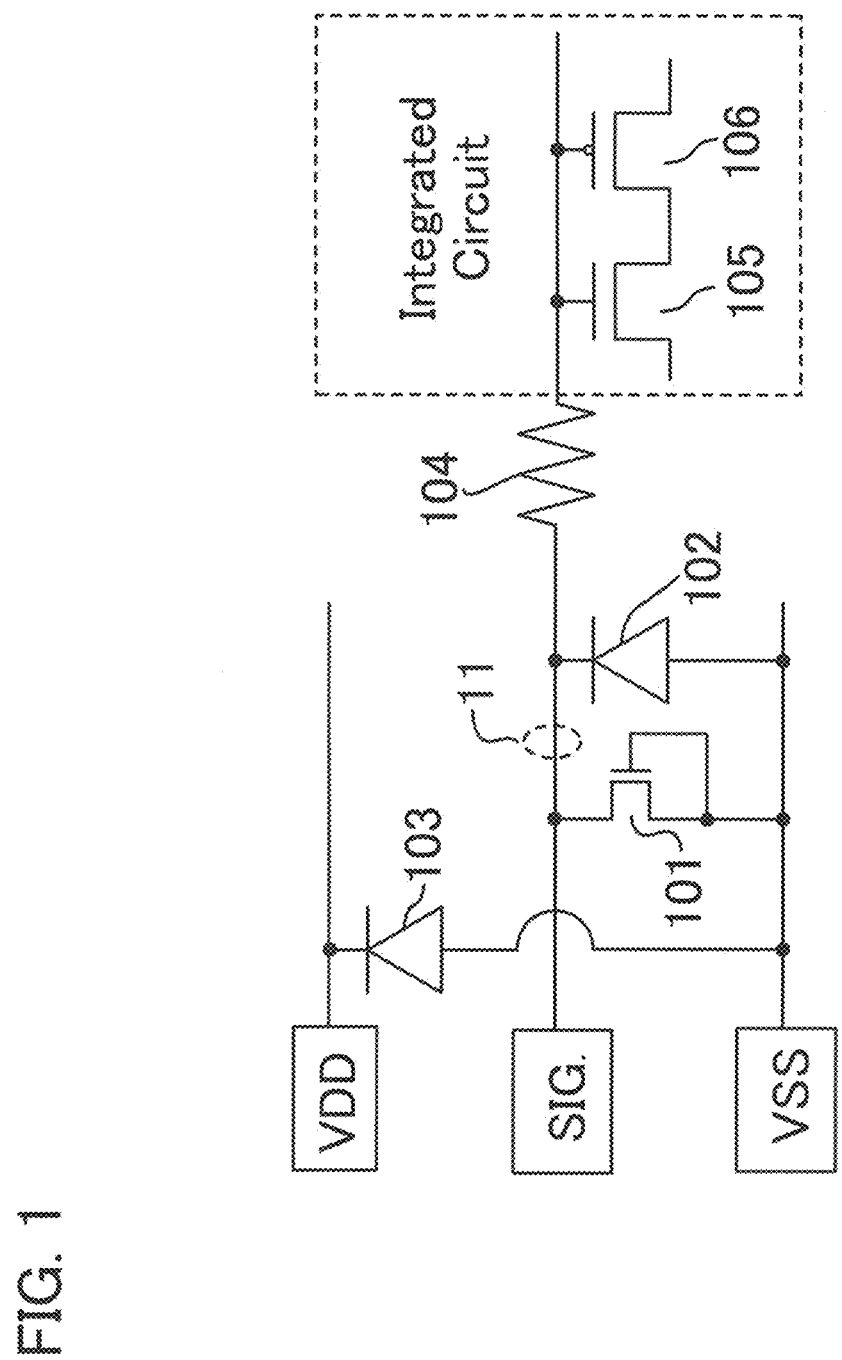
FIG. 1 is a diagram illustrating one mode of Embodiment 1.
Figure 2:
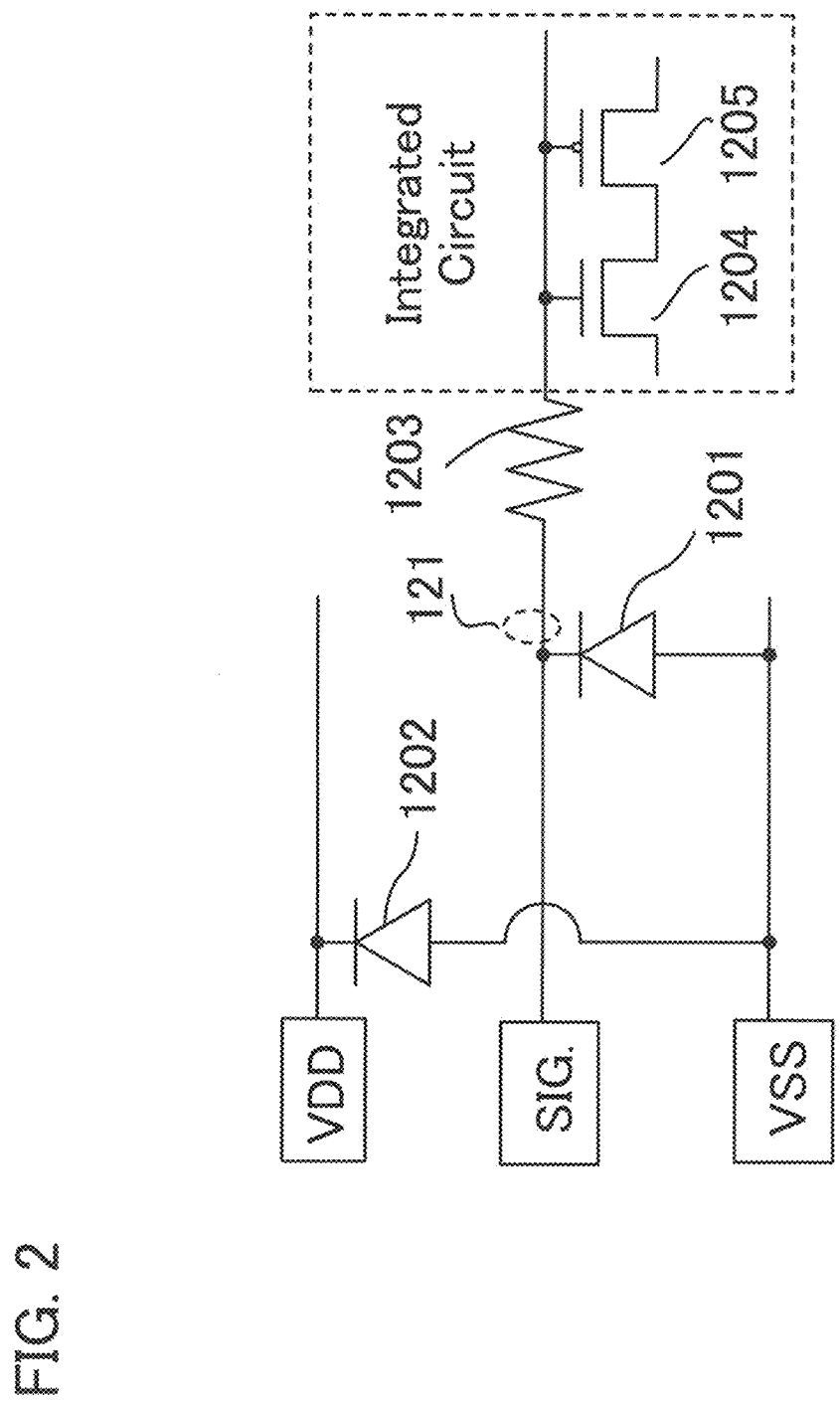
FIG. 2 is a diagram illustrating one mode of Embodiment 2.
Figure 3:
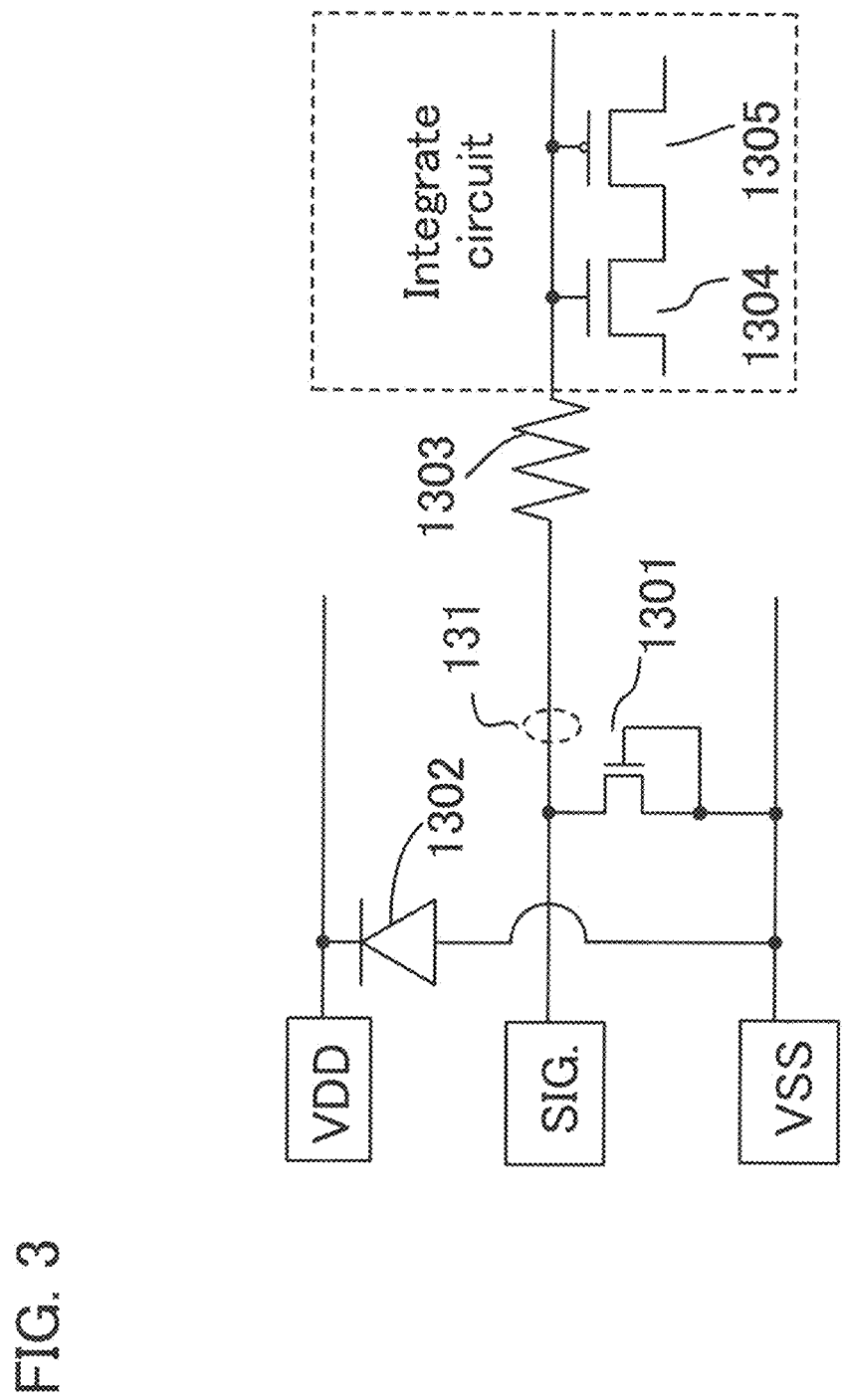
FIG. 3 is a diagram illustrating one mode of Embodiment 3.

FIG. 1 illustrates a circuit including a signal line (SIG), a high potential power supply line (VDD), a low potential power supply line (VSS), and an integrated circuit (here, complementary transistors are illustrated as an example; however, one mode of the present invention is not limited thereto, and the same can be said for FIG. 2 and FIG. 3). In the case where a high potential signal of SIG. has a potential higher than that of VDD, a diode 102 and a diode-connected transistor 101 are provided between SIG. and VSS, a diode 103 is provided between VSS and VDD, and a resistor 104 connected in series is provided. This resistor connected in series is not necessarily provided.

By provision of the diode 102 and the diode 103, when a signal having a potential higher than that of VDD is input to SIG and the potential of the signal exceeds the threshold, current flows through VSS to VDD.

In the case where the diode 102 which is less likely to generate leakage current while a reverse bias is applied and the diode-connected transistor 101 which is likely to generate leakage current while a reverse bias is applied are provided in parallel between SIG. and VSS, when SIG. is charged to a high potential due to ESD, electric charges are quickly released to the VSS side mainly through leakage current of the diode-connected transistor 101 in a reverse bias state in a region where the ESD potential is lower than breakdown voltage of the diode 102. When the potential of SIG. is in the range of normal signal input potential, both the diode 102 and the diode-connected transistor 101 are slightly reverse-biased. Therefore, leakage current is not significantly generated and a signal can be input normally. When SIG. is charged to a low potential due to ESD, both the diode 102 and the diode-connected transistor 101 are forward-biased. Accordingly, electric charges can be quickly supplied from a VSS terminal.

Any of a PIN diode and a PN diode can be used as the diodes 102 and 103. Further, as the diode-connected transistor, a thin film transistor which is a MOS transistor, a transistor manufactured using SOI (silicon on insulator), a transistor manufactured using SIMOX (separation by implantation of oxygen), a transistor formed over a semiconductor substrate, or the like can be used.

Specifically, the circuit in FIG. 1 can be manufactured using a thin film semiconductor formed over a substrate. Lateral PIN junction diodes are used as the diodes 102 and 103. An n-channel diode-connected thin film transistor (hereinafter a thin film transistor is also referred to as a TFT) is used as the diode-connected transistor 101; however, a p-channel diode-connected thin film transistor may alternatively be used by changing connection as appropriate. Further, an n-channel TFT and a p-channel TFT are used for the integrated circuit. For the resistor, a thin film semiconductor having n-type or p-type conductivity can be used. In the above-described manner, semiconductor devices can be manufactured over one substrate without increasing the number of steps.

A diode-connected TFT, which is likely to leak current, can release electric charges due to ESD with a small potential difference. On the contrary, a lateral PIN junction diode, which has high withstand voltage, is excellent in releasing electric charges due to ESD with a large potential difference. By utilizing both of the properties, a protection circuit which has high withstand voltage can be obtained.

Embodiment 2

Another embodiment of the present invention will be described in a manner similar to that of Embodiment 1. Here, a protection circuit according to one mode of the present invention is applied to an integrated circuit using a semiconductor.

FIG. 2 illustrates an example of a configuration of a protection circuit provided for a signal line (SIG) for inputting a signal to an integrated circuit. The protection circuit includes a resistor 1203 provided in series between the signal line and the integrated circuit, a diode 1201 provided between SIG. and VSS, and a diode 1202 provided between VDD and VSS. Note that the resistor 1203 is not necessarily provided.

In the circuit of FIG. 2, when SIG. is negatively charged due to ESD, electric charges are released through the diode 1201 to the VSS side. When SIG is positively charged due to ESD, electric charges are released toward VDD, passing through the diode 1201, VSS, and the diode 1202.

Specifically, the circuit in FIG. 2 can be manufactured using a thin film semiconductor formed over a substrate. Lateral PIN junction diodes are used as the diodes 1201 and 1202. An n-channel TFT and a p-channel TFT are used for the integrated circuit. For the resistor, a thin film semiconductor having n-type or p-type conductivity can be used. In this manner, semiconductor devices can be manufactured over one substrate without increasing the number of steps.

Embodiment 3

Another embodiment of the present invention will be described in a manner similar to those of Embodiment 1 and Embodiment 2. Here, a protection circuit according to one mode of the present invention is applied to an integrated circuit using a semiconductor.

FIG. 3 illustrates an example of a configuration of a protection circuit provided for a signal line (SIG) for inputting a signal to an integrated circuit. The protection circuit includes a resistor 1303 provided in series between the signal line and the integrated circuit, a diode-connected transistor 1301 provided between SIG. and VSS, and a diode 1302 provided between VDD and VSS. Note that the resistor 1303 is not necessarily provided.

In the circuit of FIG. 3, when SIG. is negatively charged due to ESD, electric charges are released through the diode-connected transistor 1301 to the VSS side. When SIG. is positively charged due to ESD, electric charges are released toward VDD, passing through the diode-connected transistor 1301, VSS, and the diode 1302.

Specifically, the circuit in FIG. 3 can be manufactured using a thin film semiconductor formed over a substrate. A lateral PIN junction diode is used as the diode 1302. An n-channel diode-connected thin film transistor is used as the diode-connected transistor 1301; however, a p-channel diode-connected thin film transistor may alternatively be used by changing connection as appropriate. Further, an n-channel TFT and a p-channel TFT are used for the integrated circuit. For the resistor, a thin film semiconductor having n-type or p-type conductivity can be used. In this manner, semiconductor devices can be manufactured over one substrate without increasing the number of steps.

Embodiment 4

Figure 4:
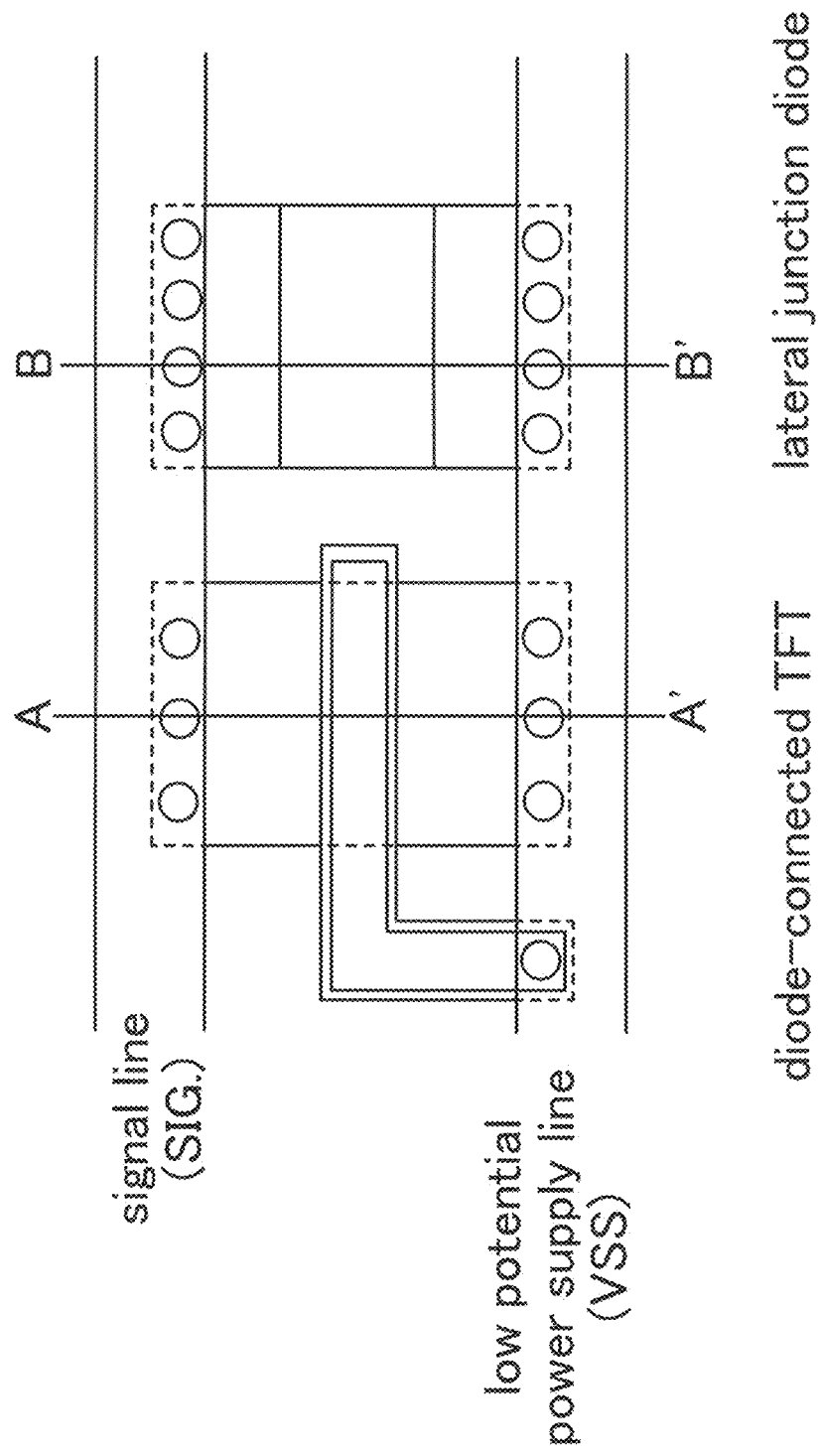
FIG. 4 is a diagram illustrating one mode of Embodiment 4.

In one mode of this embodiment, a method for manufacturing a semiconductor device including a protection circuit will be described. FIG. 4 illustrates a plan view of a lateral junction diode and a diode-connected thin film transistor (TFT) in a protection circuit. FIGS. 5A to 5E, FIGS. 6A to 6D, FIGS. 7A to 7C, FIGS. 8A and 8B, FIGS. 9A and 913, FIG. 10, and FIG. 11 each illustrate a cross-sectional view of the diode-connected TFT taken along A-A' and the lateral junction diode taken along B-B'.

A method for manufacturing the thin film transistor 101, thin film transistors 105 and 106, and the lateral PIN junction diodes 102 and 103 are described with reference to FIGS. 5A to 5E and FIGS. 6A to 6D. Thin film transistors 1204 and 1205 and the lateral PIN junction diodes 1201 and 1202 in Embodiment 2 (FIG. 2) can also be manufactured by a method similar to that of this embodiment. Further, the thin film transistor 1301, thin film transistors 1304 and 1305, and the lateral PIN junction diode 1302 in Embodiment 3 (FIG. 3) can also be manufactured by a method similar to that of this embodiment.

First, a glass substrate 500 is prepared. A non-alkali glass substrate is preferably used as the glass substrate 500. As the non-alkali glass substrate, for example, an aluminosilicate glass substrate, an aluminoborosilicate glass substrate, a barium borosilicate glass substrate, or the like can be used. Instead of the glass substrate 500, a quartz substrate can be used.

Figure 5A:
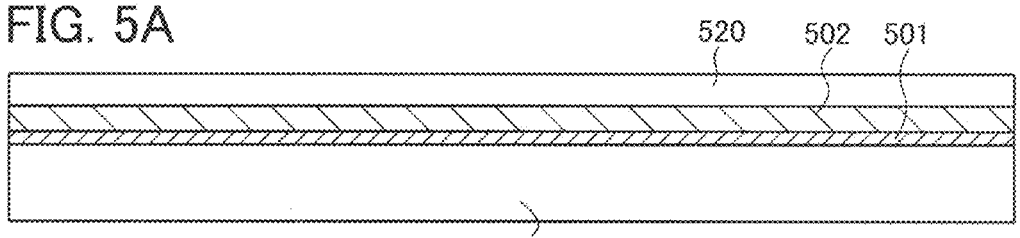
FIGS. 5A to 5E are views illustrating one mode of Embodiment 4.

Next, a base insulating film having a thickness of from 50 nm to 300 nm is formed over the glass substrate 500. Here, as illustrated in FIG. 5A, a two-layer insulating film of a silicon nitride oxide film 501 and a silicon oxynitride film 502 is formed as the base insulating film. Next, a semiconductor film 520 having a thickness of from 20 nm to 100 nm is formed over the base insulating film so as to be semiconductor films of the diodes 102 and 103 and the transistors 101 and 105.

The base insulating film is provided so as to prevent alkali metal (typically Na) or alkaline earth metal included in the glass substrate 500 from diffusing and adversely affecting electric characteristics of a semiconductor element such as a transistor. The base insulating film may have either a single-layer structure or a stacked structure; however, the base insulating film preferably includes at least one barrier film for preventing diffusion of alkali metal and alkaline earth metal. In this embodiment, the silicon nitride oxide film 501 is provided as a barrier film. As the barrier film, a nitride oxide film such as a silicon nitride oxide film, or a nitride film such as a silicon nitride film or an aluminum nitride film is preferably used. In order to decrease the interface state density between the semiconductor film and the base insulating film which are included in the transistors 101 and 105, the silicon oxynitride film 502 is formed.

In this embodiment, the 140-nm-thick silicon nitride oxide film 501, the 100-nm-thick silicon oxynitride film 502, and a 50-nm-thick amorphous silicon film 520 are successively formed using one PECVD apparatus. The source gas of the silicon nitride oxide film 501 is $SiH_4$, $N_2O$, $NH_3$, and $H_2$. The source gas of the silicon oxynitride film 502 is $SiH_4$ and $N_2O$. The source gas of the amorphous silicon film 520 is $SiH_4$ and $H_2$. By changing the source gases, the three films can be successively formed in one chamber.

In this embodiment, the transistors 101, 105, and 106 and the diodes 102 and 103 are formed using a crystalline semiconductor film. Therefore, an amorphous semiconductor film is crystallized so that a crystalline semiconductor film is formed. As a method for crystallizing the semiconductor film, a solid phase growth method using a lamp annealing apparatus or a furnace, a laser crystallization method by which the semiconductor film is melted and crystallized by laser light irradiation, or the like can be used.

Figure 5B:
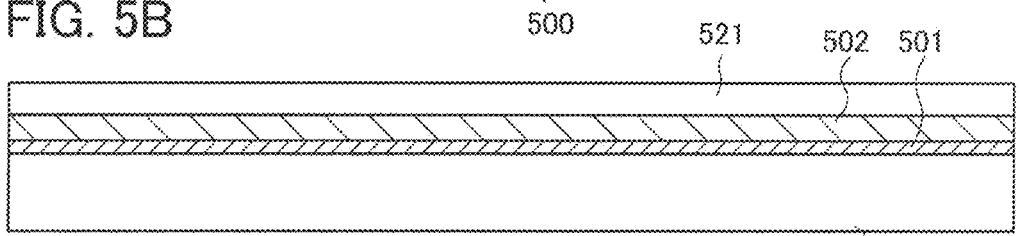

Here, the amorphous silicon film 520 is formed over the base insulating film and is subjected to solid phase growth to be crystallized, so that a crystalline silicon film 521 is formed (see FIGS. 5A and 5B). Here, in order to perform the solid phase growth on the amorphous silicon film 520 at a heating temperature lower than or equal to 600° C. in a short time, a metal element is added to the amorphous silicon film 520. A method for crystallizing the amorphous silicon film 520 is specifically described below.

First, a surface of the amorphous silicon film 520 is cleaned with ozone water so that an ultrathin (several-nanometer-thick) oxide film is formed. Thus, the wettability of the surface of the amorphous silicon film 520 is improved. Then, the surface of the amorphous silicon film 520 is coated with a nickel acetate solution containing 10 ppm by weight of nickel by a spinner.

Next, the amorphous silicon film 520 is heated in a furnace so that the crystalline silicon film 521 is formed. In order to crystallize the amorphous silicon film 520, the amorphous silicon film 520 is heated, for example, at 500° C. for 1 hour, and then, is heated at 550° C. for 4 hours. With the catalytic action of nickel, the crystalline silicon film 521 can be formed at low temperature in a short time. Further, with the catalytic action of nickel, the crystalline silicon film 521 having few dangling bonds at crystal grain boundaries can be formed. As a metal element which promotes the crystallization of silicon, Fe, Co, Ru, Rh, Pd, Os, Ir, Pt, or the like can be used instead of Ni.

As a method for introducing such a metal element into the amorphous silicon film 520, a method by which a film containing a metal element as its main component is formed on the surface of the amorphous silicon film 520, a method by which a metal element is added to the amorphous silicon film 520 by a plasma doping method or the like, or the like can be used instead of the method by which the amorphous silicon film 520 is coated with a solution of such a metal element.

Next, in order to reduce the crystal defects in the crystalline silicon film 521 and to improve the degree of crystallization, the crystalline silicon film 521 is irradiated with laser light. Here, the crystalline silicon film 521 is irradiated with excimer laser light (XeCl: a wavelength of 308 nm). A beam having a wavelength less than or equal to 400 nm is preferably used as the laser light. As such laser light, for example, excimer laser light such as XeCl excimer laser light, the second harmonic or the third harmonic of a YAG laser, or the like can be used. Before the laser light irradiation, an oxide film formed on a surface of the crystalline silicon film 521 is preferably removed using dilute hydrofluoric acid or the like.

In this embodiment, treatment for gettering of nickel, which is introduced for the crystallization, from the crystalline silicon film 521 is performed for the following reason. Nickel is useful for the crystallization of the amorphous silicon film 520; however, if nickel is included in the crystalline silicon film 521 at high concentration, nickel might be a factor of making the electric characteristics of the transistors 101 and 105 worse, for example, the leakage current of the transistors 101 and 105 is increased. An example of the gettering treatment is described below.

First, the surface of the crystalline silicon film 521 is cleaned with ozone water for about 120 seconds so that an oxide film having a thickness of approximately 1 nm to 10 nm is formed on the surface of the crystalline silicon film 521. Instead of the surface treatment with ozone water, UV light irradiation may be performed. Next, an amorphous silicon film containing Ar is formed to a thickness of approximately 10 nm to 400 nm on the surface of the crystalline silicon film 521 with the oxide film interposed therebetween. The concentration of Ar in the amorphous silicon film is preferably higher than or equal to $1 \times 10^{18}$ atoms/cm$^3$ and lower than or equal to $1 \times 10^{22}$ atoms/cm$^3$. In addition, instead of Ar, another element of Group 18 may be added to the amorphous silicon film.

An element of Group 18 is added to the amorphous silicon film in order to form a gettering site in the amorphous silicon film by generating distortion in the amorphous silicon film. There are two factors which cause the distortion by the addition of the element of Group 18. One is the formation of dangling bonds in crystals by the addition of the element of Group 18. The other is the addition of the element of Group 18 between crystal lattices.

For example, in order to form the amorphous silicon film containing Ar (hereinafter referred to as an Ar:a-Si film) by a PECVD method, SiH$_4$, H$_2$, and Ar may be used as a source gas. The flow ratio of SiH$_4$ to Ar (SiH$_4$/Ar) is preferably greater than or equal to 1/999 and less than or equal to 1/9. Further, process temperature is preferably from 300° C. to 500° C. RF power density for exciting the source gas is preferably higher than or equal to 0.0017 W/cm$^2$ and lower than or equal to 0.48 W/cm$^2$. Process pressure is preferably higher than or equal to 1.333 Pa and lower than or equal to 66.65 Pa.

For example, in the case of forming the Ar:a-Si film by a sputtering method, single crystal silicon may be used as a target and Ar may be used as a sputtering gas. By performing grow discharge of the Ar gas and sputtering of the single crystal silicon target with Ar ions, the amorphous silicon film containing Ar can be formed. The concentration of Ar in the amorphous silicon film can be adjusted in accordance with power, pressure, temperature, or the like for the grow discharge. Process pressure is preferably higher than or equal to 0.1 Pa and lower than or equal to 5 Pa. As the pressure is decreased, the concentration of Ar in the amorphous silicon film can be made higher. Thus, the pressure is preferably lower than or equal to 1.5 Pa. The glass substrate 500 is not necessarily heated in the process, and the process temperature is preferably lower than or equal to 300° C.

After the Ar:a-Si film is formed, heat treatment at 650° C. for 3 minutes is performed in a furnace for gettering. With this heat treatment, Ni contained in the crystalline silicon film 521 is separated out to the Ar:a-Si film and is captured. Accordingly, the concentration of Ni in the crystalline silicon film 521 can be lowered. After the heat treatment is completed, the Ar:a-Si film is removed by etching. In this etching, the oxide film serves as an etching stopper. After the Ar:a-Si film is removed, the oxide film formed on the surface of the crystalline silicon film 521 is removed using dilute hydrofluoric acid or the like. Thus, the crystalline silicon film 521 in which the concentration of Ni is reduced is formed.

Next, an acceptor element is added to the crystalline silicon film 521 so that the threshold voltage of the transistors 101 and 105 is controlled. For example, boron is used as an acceptor element and is added to the crystalline silicon film 521 so as to be contained at a concentration of from $1 \times 10^{16}$ atoms/cm$^3$ to $5 \times 10^{17}$ atoms/cm$^3$.

Figure 5C:
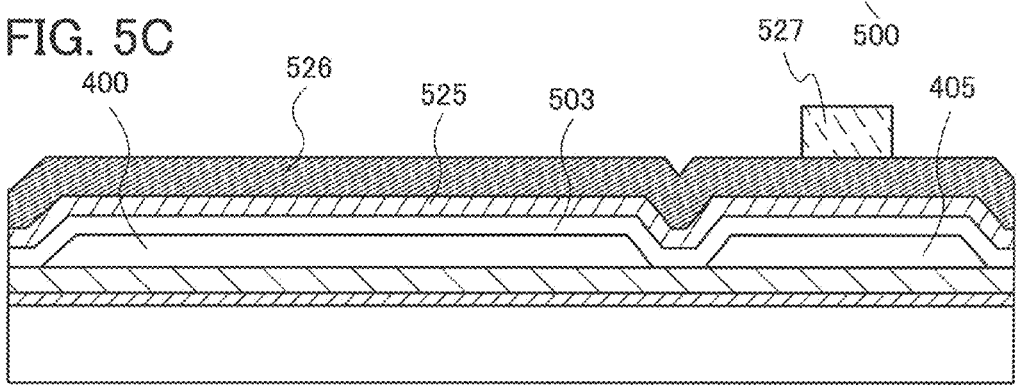

Then, a resist mask is formed over the crystalline silicon film 521, and the crystalline silicon film 521 is etched using the resist mask so that a semiconductor film 400 used for the diodes 102 and 103 and a semiconductor film 405 of the n-channel TFTs 101 and 105 are formed, as illustrated in FIG. 5C.

In this embodiment, the semiconductor films 400 and 405 are formed using a silicon film; however, the semiconductor films 400 and 405 can also be formed using a semiconductor film including any other element of Group 14, such as germanium, silicon germanium, or silicon carbide. Alternatively, a compound semiconductor film of GaAs, InP, SiC, ZnSe, GaN, SiGe, or the like or an oxide semiconductor film of zinc oxide, tin oxide, InGaZnO, or the like can be used.

Next, as illustrated in FIG. 5C, a gate insulating film is formed over the semiconductor films 400 and 405. Here, as the gate insulating film, a 30-nm-thick silicon oxynitride film 503 is formed. The silicon oxynitride film 503 is formed using SiH$_4$ and N$_2$O as a source gas by a PECVD method.

In addition, as a conductive film used as the conductive film 410, a conductive film having a two-layer structure of a 30-nm-thick tantalum nitride film 525 and a 170-nm-thick tungsten film 526 is formed over the gate insulating film. The tantalum nitride film 525 and the tungsten film 526 are formed by a sputtering method. Instead of the stacked film of the tantalum nitride film 525 and the tungsten film 526, for example, a stacked film of a tungsten nitride film and a tungsten film or a stacked film of a molybdenum nitride film and a molybdenum film can be formed. In this embodiment, since a source region, a drain region, and a low concentration impurity region are formed in the semiconductor film 405 in a self-aligned manner by using the conductive film 410 as a mask for addition of an impurity, the upper-layer conductive film is made smaller than the lower-layer conductive film when viewed from above. In order to facilitate the formation of the conductive film 410, the etching selectivity of the upper-layer conductive film with respect to the lower-layer conductive film is preferably high. In this respect, the stacked film of the tantalum nitride film 525 and the tungsten film 526 is preferable.

Figure 5D:
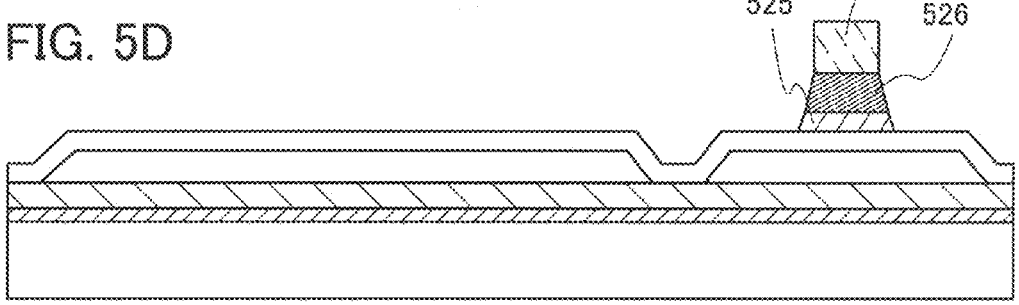

Next, a resist mask 527 is formed over the tungsten film 526. Etching is performed twice using the resist mask 527. First, as illustrated in FIG. 5D, the tantalum nitride film 525 and the tungsten film 526 are etched using the resist mask 527. By this first etching, a cross section of the stacked film of the tantalum nitride film 525 and the tungsten film 526 are tapered. For example, this etching can be performed using a mixture gas of CF$_4$, Cl$_2$, and O$_2$ as an etching gas with the use of an inductively coupled plasma (ICP) etching apparatus.

Figure 5E:
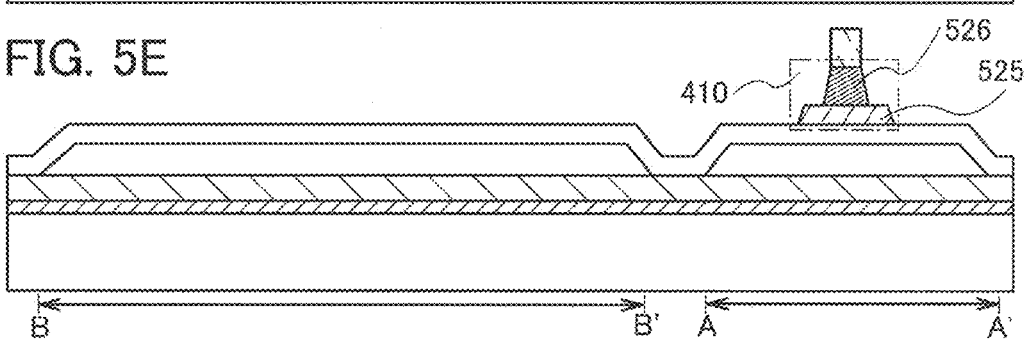

Further, as illustrated in FIG. 5E, the upper-layer tungsten film 526 is selectively etched using the resist mask 527. This etching is anisotropic etching and can be performed using a mixture gas of Cl$_2$, SF$_6$, and O$_2$ as an etching gas with the use of an ICP etching apparatus, for example. By this second etching, the first conductive film 410 is formed. In the conductive film 410, end portions of the tungsten film 526 are on a top surface of the tantalum nitride film 525, and the tungsten film 526 is smaller than the tantalum nitride film 525 when viewed from above.

Figure 6A:
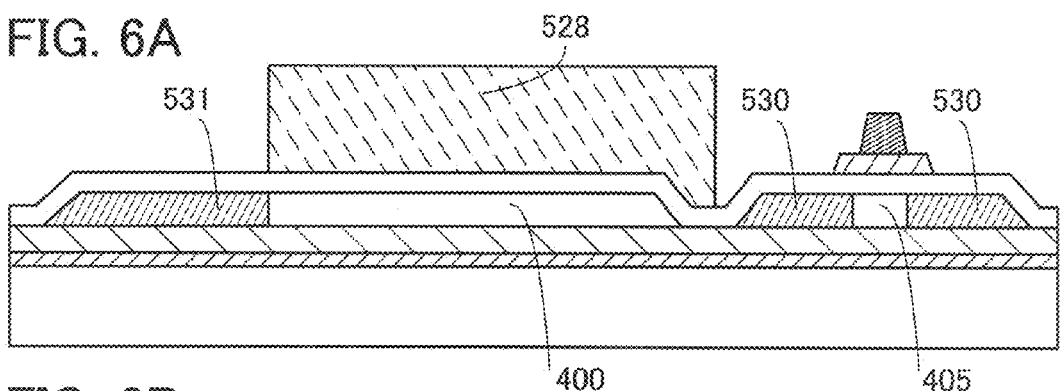
FIGS. 6A to 6D are views illustrating one mode of Embodiment 4.

After the resist mask 527 is removed, a resist mask 528 is formed so as to cover regions serving as a high-resistance region and a p-type impurity region of the semiconductor film 400, as illustrated in FIG. 6A. Then, a donor element is added to the semiconductor films 400 and 405 so that n-type impurity regions are formed. Here, phosphorus is added as the donor element. First, in order to form n-type low concentration impurity regions in the semiconductor film 405, phosphorus is added to the semiconductor films 400 and 405 under conditions of a low dosage and high accelerating voltage. PH$_3$ can be used for a source gas of phosphorus. Under these conditions, only a portion of the conductive film 410, where the tantalum nitride film 525 and the tungsten film 526 are stacked, serves as a mask, and phosphorus is added through a portion of the conductive film 410, where only the tantalum nitride film 525 is formed, so that low concentration impurity regions 530 are formed in the semiconductor film 405. Further, a low concentration impurity region 531 is formed in the semiconductor film 400.

Figure 6B:
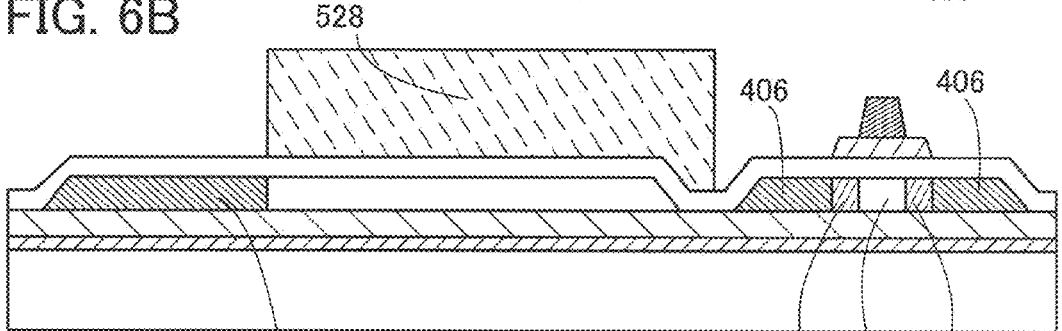

Next, in order to form source regions and drain regions of the transistors 101 and 105 and n-type impurity regions of the diodes 102 and 103, phosphorus is added under conditions of a high dosage and low accelerating voltage. Under these conditions, the entire conductive film 410 serves as a mask, and n-type high concentration impurity regions 406, n-type low concentration impurity regions 407, and a channel formation region 408 are formed in the semiconductor film 405 in a self-aligned manner, as illustrated in FIG. 6B. The n-type high concentration impurity regions 406 serve as a source region and a drain region. Further, an n-type impurity region 401 which is used for a PIN junction is formed in the semiconductor film 400.

Figure 6C:
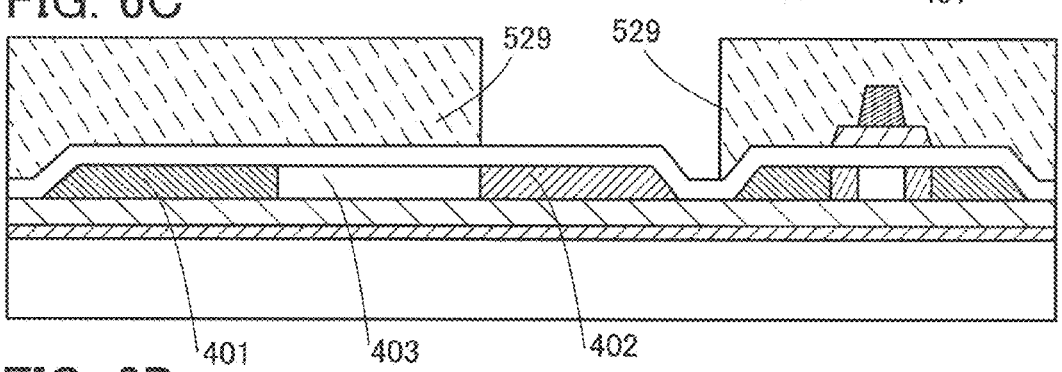

After the resist mask 528 is removed, a resist mask 529 is formed so as to cover the entire semiconductor film 405 and regions serving as the high-resistance region and the n-type impurity region of the semiconductor film 400, as illustrated in FIG. 6C. Then, an acceptor element is added to the semiconductor film 400 and regions to be p-type high concentration impurity regions of the p-channel TFT 106 so that p-type impurity regions are formed. Here, boron is added as the acceptor element. $B_2H_6$ can be used for a source gas of boron. By adding boron to the semiconductor film 400 and the regions to be p-type high concentration impurity regions of the p-channel TFT 106 under conditions of a high dosage and low accelerating voltage, p-type impurity regions 402 are formed in the semiconductor film 400, and a high concentration impurity region (not shown) of the p-channel TFT 106 is formed. Further, in the semiconductor film 400, a region where the donor element and the acceptor element are not added in the steps of adding impurity elements in FIGS. 6A to 6C serves as a high-resistance region 403.

Figure 6D:
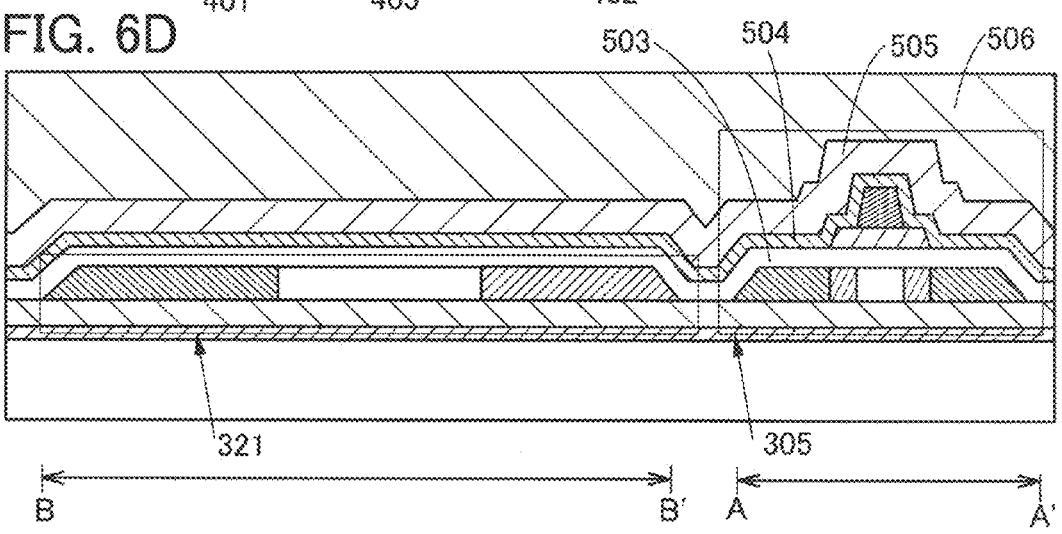
Figure 10:
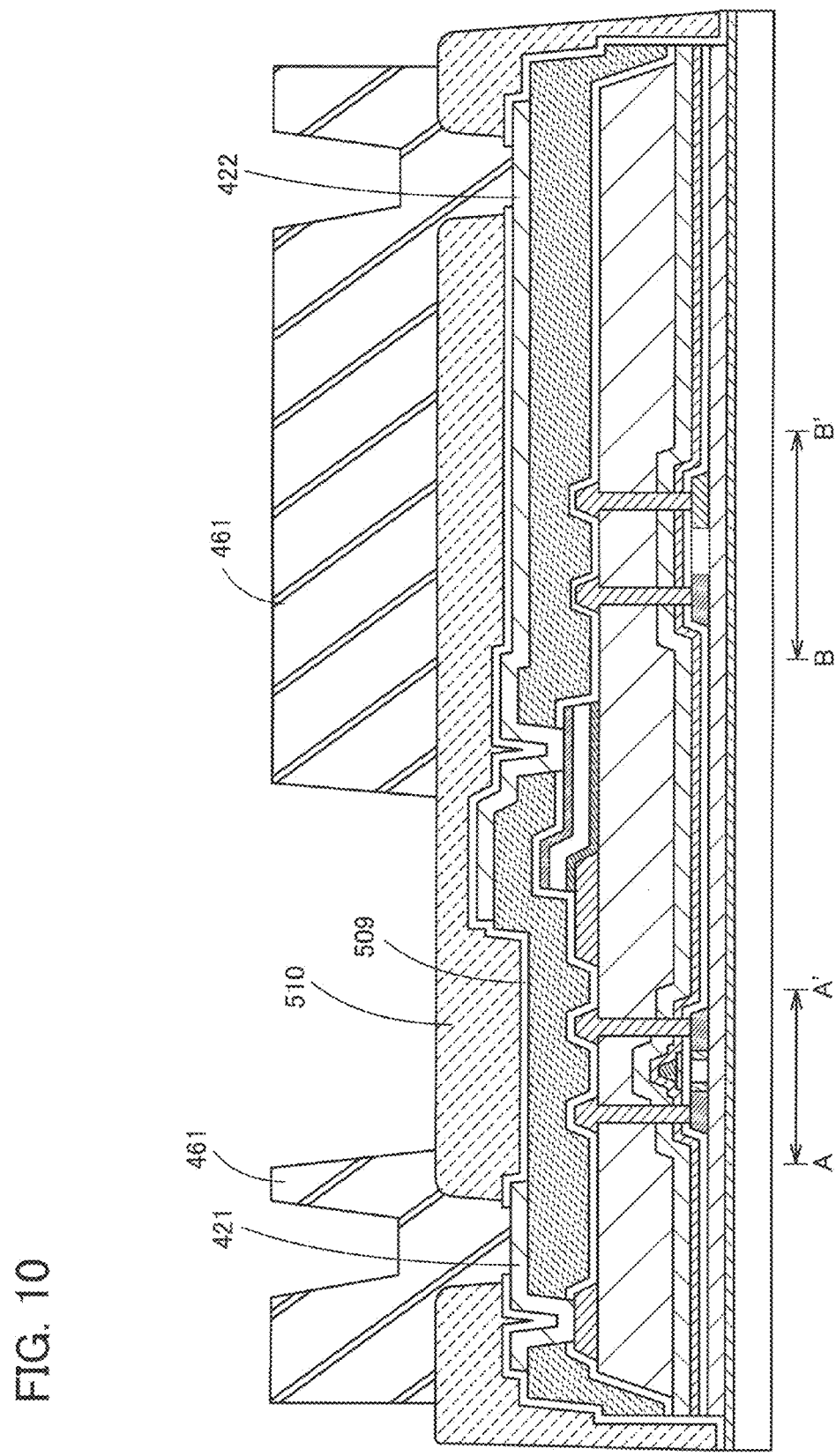
FIG. 10 is a view illustrating one mode of Embodiment 5.

After the resist mask 529 is removed, a first interlayer insulating film is formed over the glass substrate 500 so as to cover the conductive film 410, as illustrated in FIG. 6D. In this embodiment, the first interlayer insulating film has a three-layer structure. A first layer is a 30-nm-thick silicon oxynitride film 504. A second layer is a 165-nm-thick silicon nitride oxide film 505. A third layer is a 600-nm-thick silicon oxynitride film 506. These films 504 to 506 are formed using a PECVD apparatus.

First, the silicon oxynitride film 504 is formed using $SiH_4$ and $N_2O$ for a source gas. Then, heat treatment is performed so that phosphorus and boron, which are added to the semiconductor films 400 and 405, are activated. Here, heat treatment is performed at 480° C. for 1 hour. After the heat treatment is completed, the silicon nitride oxide film 505 and the silicon oxynitride film 506 are formed using a PECVD apparatus. $SiH_4$, $N_2O$, $NH_3$, and $H_2$ are used for a source gas of the silicon nitride oxide film 505 so that the concentration of hydrogen in the silicon nitride oxide film 505 is high. $SiH_4$ and $N_2O$ are used for a source gas of the silicon oxynitride film 506. After the silicon oxynitride film 506 is formed, heat treatment is performed so that hydrogen contained in the silicon nitride oxide film 505 is dispersed, whereby dangling bonds in the semiconductor films 400 and 405 are terminated with hydrogen. This heat treatment can be performed at a temperature of from 300° C. to 550° C.

Note that a circuit according to one mode of the present invention needs to have resistance of from 2 kΩ to 4 kg. Therefore, the lateral junction diode preferably has a channel width of from 600 μm to 1000 μm and a channel length of from 2 μm to 6 μm. The diode-connected TFT preferably has a channel width of from 3000 μm to 4000 μm and a channel length of from 2 μm to 6 μm.

In this embodiment, the case where a transistor in a functional circuit is manufactured at the same time as a diode and a transistor in a protection circuit is described. It is preferable to form a diode and a transistor in a protection circuit with the use of a semiconductor film that is formed in the same step as a semiconductor film of a transistor in a functional circuit in a manner similar to this embodiment because steps are not complicated.

In this manner, a semiconductor device which is formed using an insulating substrate can be completed. As examples of a device manufactured through the above-described steps, a photoelectric conversion device, a liquid crystal display device, and a semiconductor device manufactured using SOI (silicon on insulator) can be given. By application of the above description, such devices can be easily manufactured by those skilled in the art. In a similar manner, the above description can also be applied to a semiconductor device such as an LSI.

This embodiment can be implemented in combination with any of the other embodiments as appropriate.

Embodiment 5

In one mode of this embodiment, steps of manufacturing a photoelectric conversion device after manufacturing a transistor in a functional circuit, and a diode and a transistor in a protection circuit will be described with reference to cross-sectional views of FIGS. 7A to 7C, FIGS. 8A and 8B, FIGS. 9A and 9B, FIG. 10, and FIG. 11.

In FIG. 6D, the stacked film formed using the silicon oxynitride film 503, the silicon oxynitride film 504, the silicon nitride oxide film 505, and the silicon oxynitride film 506 is etched using a resist mask so that openings which serve as contact holes are formed.

Next, a conductive film used for second conductive films 411 to 414 is formed over the silicon oxynitride film 506. Here, a 400-nm-thick titanium film is formed by a sputtering method. A resist mask is formed over the titanium film and is used for etching of the titanium film so that the conductive films 411 to 414 are formed (see FIG. 7A).

Note that the second conductive films 411 to 414 and third conductive films 421 and 422 are each preferably formed using a film of titanium, a titanium alloy, a titanium compound, molybdenum, a molybdenum alloy, or a molybdenum compound. The film formed using such a conductive material has advantages that heat resistance is high, electrolytic corrosion due to contact with a silicon film does not easily occur, migration does not easily occur, and so forth.

Next, as illustrated in FIG. 7A, a photoelectric conversion layer 450 used for a photodiode 301 is formed over the silicon oxynitride film 506. Here, an amorphous silicon film is formed as the photoelectric conversion layer 450 with the use of a PECVD apparatus. Further, in order to provide a PIN junction in the photoelectric conversion layer 450, the photoelectric conversion layer 450 has a three-layer structure of a layer which has p-type conductivity, a layer which has i-type (intrinsic) conductivity, and a layer which has n-type conductivity. Note that the photoelectric conversion layer 450 is not limited to the amorphous silicon film, and may be either a microcrystalline silicon film or a single crystal silicon film, for example.

First, a 60-nm-thick p-type amorphous silicon film 451, a 400-nm-thick i-type amorphous silicon film 452, and an 80-nm-thick n-type amorphous silicon film 453 are successively formed using a PECVD apparatus so as to cover the conductive films 411 to 414. Boron is added using $SiH_4$, $H_2$, and $B_2H_6$ for a source gas of the p-type amorphous silicon film 451. An amorphous silicon film to which an impurity element serving as a donor or an acceptor is not added intentionally is formed using $SiH_4$ and $H_2$ for a source gas of the i-type amorphous silicon film 452. Phosphorus is added using $SiH_4$, $H_2$, and $PH_3$ for a source gas of the n-type amorphous silicon film 453. Then, the stacked film formed using the amorphous silicon films 451 to 453 is etched using a resist mask so that the photoelectric conversion layer 450 is formed (see FIG. 7A).

Here, a plurality of photoelectric conversion devices is simultaneously manufactured over one glass substrate 500. After the photoelectric conversion devices are completed, the glass substrate 500 is cut in accordance with the size of the photoelectric conversion devices so that separate photoelectric conversion devices are obtained. Here, in order to favorably perform passivation on side surfaces of the divided photoelectric conversion devices, portions of the silicon oxynitride film 506, which are peripheral portions 541 (portions indicated by dotted lines) of the photoelectric conversion device, are removed as illustrated in FIG. 7B. This step can be performed by etching.

Next, a second interlayer insulating film is formed so as to cover the silicon nitride oxide film 505, the silicon oxynitride film 506, the conductive films 411 to 414, and the photoelectric conversion layer 450. Here, as illustrated in FIG. 7C, a two-layer insulating film formed using a 100-nm-thick silicon nitride oxide film 507 and an 800-nm-thick silicon oxide film 508 is formed.

The silicon nitride oxide film 507 is formed in a PECVD apparatus, using $SiH_4$, $N_2O$, $NH_3$, and $H_2$ for a source gas. The silicon nitride oxide film 507 serves as a passivation film. Instead of the silicon nitride oxide film 507, a silicon nitride film may be formed. The silicon nitride film can be formed in a PECVD apparatus, using $SiH_4$, $NH_3$, and $H_2$ for a source gas. Further, the silicon oxide film 508 is formed in a PECVD apparatus, using $O_2$ and tetraethoxysilane (abbreviation: TEOS and chemical formula: $Si(OC_2H_5)_4$) for a source gas. Instead of the silicon oxide film 508, a silicon oxynitride film may be formed using a PECVD apparatus.

Next, the stacked film formed using the silicon nitride oxide film 507 and the silicon oxide film 508 is etched using a resist mask so that a plurality of openings is formed.

Next, a conductive film used for the third conductive films 421 and 422 is formed over the silicon oxide film 508. Here, a 200-nm-thick titanium film is formed by a sputtering method. A resist mask is formed over the titanium film and is used for etching of the titanium film so that the conductive films 421 and 422 are formed (see FIG. 8A).

Next, as illustrated in FIG. 8B, the insulating films 502 to 508 are removed from peripheral portions 542 (portions indicated by dotted lines) of the photoelectric conversion device while the silicon nitride oxide film 501 is left. This step can be performed by etching. The insulating films are removed from the peripheral portions of the integrated circuit in this manner in order to favorably perform passivation on the side surfaces of the photoelectric conversion devices after the glass substrate 500 is divided, in a manner similar to that of the case of removing the silicon oxynitride film 506 in the step of FIG. 7B.

Next, as illustrated in FIG. 9A, a 100-nm-thick silicon nitride oxide film 509 is formed. The silicon nitride oxide film 509 is formed using a PECVD apparatus by using $SiH_4$, $N_2O$, $NH_3$, and $H_2$ for a source gas. The silicon nitride oxide film 509 serves as a passivation film. A portion where the third conductive films 421 and 422 and all the insulating films 501 to 508 are exposed is covered with the silicon nitride oxide film 509. Therefore, in the photoelectric conversion device, the glass substrate 500 side is subjected to passivation with the silicon nitride oxide film 501 which serves as a barrier film, and a side where a power supply terminal 311 and a power supply terminal 312 are formed is subjected to passivation with the silicon nitride oxide film 509. With such a structure, invasion of moisture or an impurity such as an organic substance into the photoelectric conversion device can be prevented.

Next, as illustrated in FIG. 9B, a sealing film 510 is formed. With the sealing film 510, a top surface and side surfaces of the integrated circuit portion are sealed. The thickness of the sealing film 510 is preferably 1 μm or more, and is approximately from 1 μm to 30 p.m. In order to form the sealing film 510 thick in this manner, the sealing film 510 is preferably formed using a resin film.

Next, the power supply terminals 311 and 312 are formed over the sealing film 510.

In this embodiment, the power supply terminals 311 and 312 are formed using a conductive film having a four-layer structure. First, first conductive films 461 are formed by a printing method such as a screen printing method. In this embodiment, each of the conductive films 461 is formed to a thickness of approximately 15 μm by a screen printing method using a conductive paste containing nickel particles (see FIG. 10).

Figure 11:
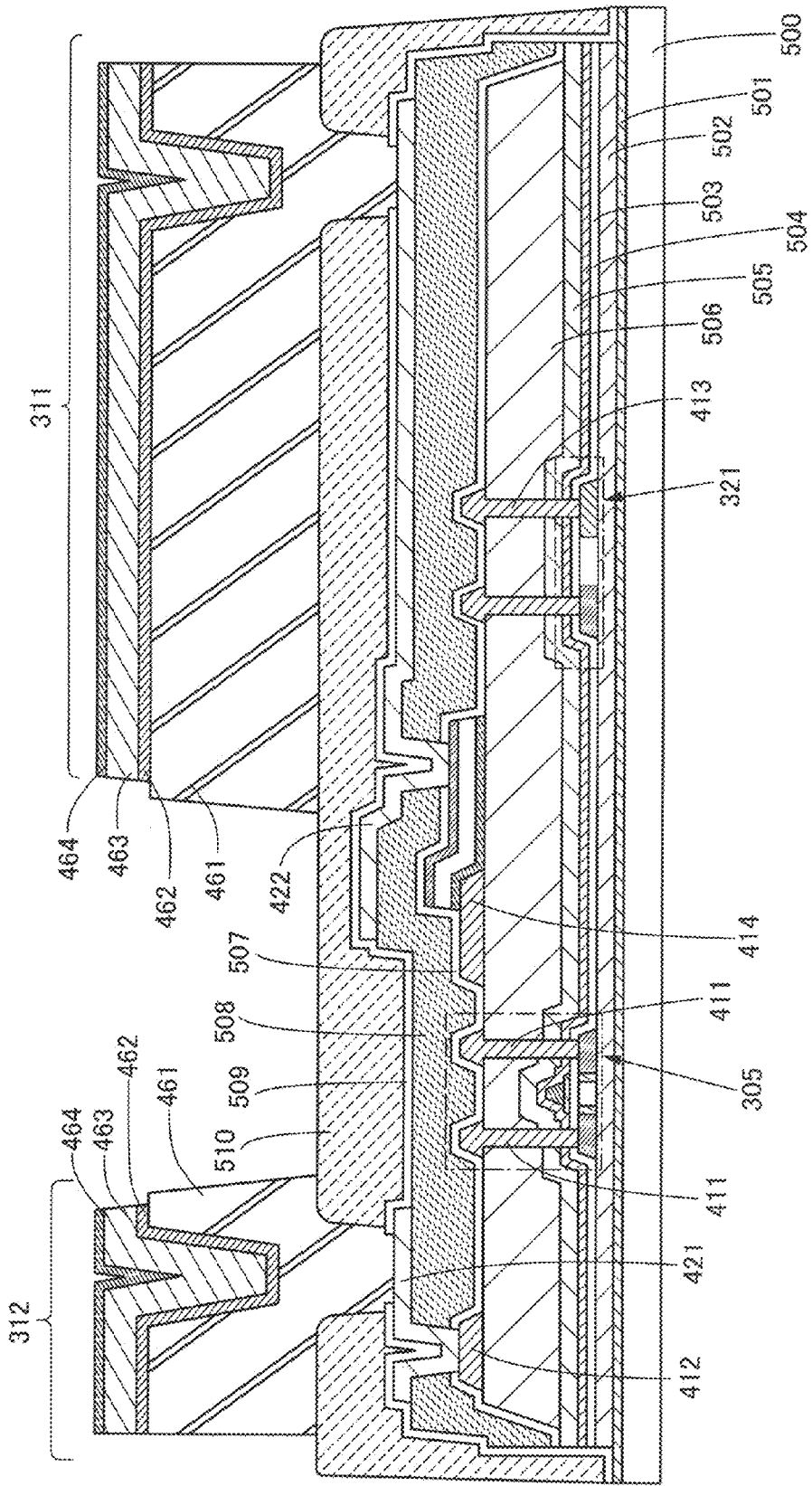
FIG. 11 is a view illustrating one mode of Embodiment 5.

A conductive paste refers to a material in which metal particles or metal powder is dispersed into a binder formed using a resin. By solidifying such a conductive paste, a conductive resin film is formed. Thus, since each of the conductive films 461 is formed using a conductive resin film, adhesion thereof to a solder is weak. Therefore, in order to improve the adhesion of the power supply terminals 311 and 312 to a solder, a conductive film having a predetermined shape is formed on each top surface of the conductive films 461 by a sputtering method using a metal mask. Here, as illustrated in FIG. 11, a three-layer conductive film is formed over each of the conductive films 461. A 150-nm-thick titanium film 462 is formed as a first conductive film. A 750-nm-thick nickel film 463 is formed as a second conductive film. A 50-nm-thick Au film 464 is formed as a third conductive film. Through the above-described steps, the power supply terminals 311 and 312 each having a four-layer structure are completed.

Next, the glass substrate 500 is cut at the peripheral portions 542 (the portions indicated by the dotted lines in FIG. 5B) of the photoelectric conversion device, and divided into separate photoelectric conversion devices. The glass substrate 500 can be cut by a dicing method, a laser cutting method, or the like. Before the glass substrate 500 is divided, the glass substrate 500 can be made thinner by polishing or grinding a rear surface of the glass substrate 500. By making the glass substrate 500 thinner, wearing out of a cutting tool used for cutting the glass substrate 500 can be reduced. Further, by making the glass substrate 500 thinner, the photoelectric conversion device can be made thinner. For example, the glass substrate 500 having a thickness of approximately 0.5 mm can be made to have a thickness of approximately 0.25 mm. In the case of making the glass substrate 500 thinner, it is preferable that the rear surface and the side surfaces of the glass substrate 500 be covered with a resin film so that the glass substrate 500 is protected.

Steps of manufacturing a photoelectric conversion device with the use of a diode and a transistor in a protection circuit and a transistor in a functional circuit are described above. Note that this embodiment can be combined with any of the other embodiments as appropriate.

Embodiment 6

In one mode of this embodiment, a use application of a photoelectric conversion device manufactured using the above protection circuit will be described.

By attaching the photoelectric conversion device to an electronic device, the operation of the electronic device can be controlled in accordance with a digital signal of the photoelectric conversion device. For example, by incorporating the photoelectric conversion device in an electronic device provided with a display panel, the illuminance of use environment can be measured by the photoelectric conversion device and the luminance of the display panel can be adjusted using a digital signal obtained in the photoelectric conversion device. In this embodiment, some examples of such electronic devices are described with reference to FIGS. 12A to 12F.

FIGS. 12A and 12B are external views of mobile phones. The mobile phones in FIGS. 12A and 12B each include a main body 1101, a display panel 1102, an operation key 1103, an audio output portion 1104, and an audio input portion 1105. In addition, the main body 1101 includes a photoelectric conversion device 1106. The mobile phones in FIGS. 12A and 12B each have a function of adjusting the luminance of the display panel 1102 in accordance with an output signal from the photoelectric conversion device 1106. Further, in the mobile phone of FIG. 12B, a photoelectric conversion device 1107 for detecting the luminance of a backlight in the display panel 1102 is incorporated in the main body 1101.

FIG. 12C is an external view of a computer. The computer includes a main body 1111, a display panel 1112, a keyboard 1113, an external connection port 1114, a pointing device 1115, and the like. Further, a photoelectric conversion device (not shown) for detecting the luminance of a backlight in the display panel 1112 is incorporated in the main body 1111.

FIG. 12D is an external view of a display device. A TV receiver, a monitor of a computer, or the like corresponds to the display device. The display device includes a housing 1121, a support base 1122, a display panel 1123, and the like. A photoelectric conversion device (not shown) for detecting the luminance of a backlight in the display panel 1123 is incorporated in the housing 1121.

FIG. 12E is an external view of a digital camera when viewed from the front side. FIG. 12F is an external view of the digital camera when viewed from the back side. The digital camera includes a release button 1131, a main switch 1132, a finder window 1133, a flashlight 1134, a lens 1135, a lens barrel 1136, a housing 1137, a finder eyepiece window 1138, a display panel 1139, operation buttons 1140, and the like. By incorporating a photoelectric conversion device in the digital camera, the luminance of a photographing environment can be detected in the photoelectric conversion device. Exposure, shutter speed, and the like can be adjusted in accordance with electric signals detected in the photoelectric conversion device.

Note that this embodiment can be combined with any of the other embodiments as appropriate.

Example 1

Figure 13:
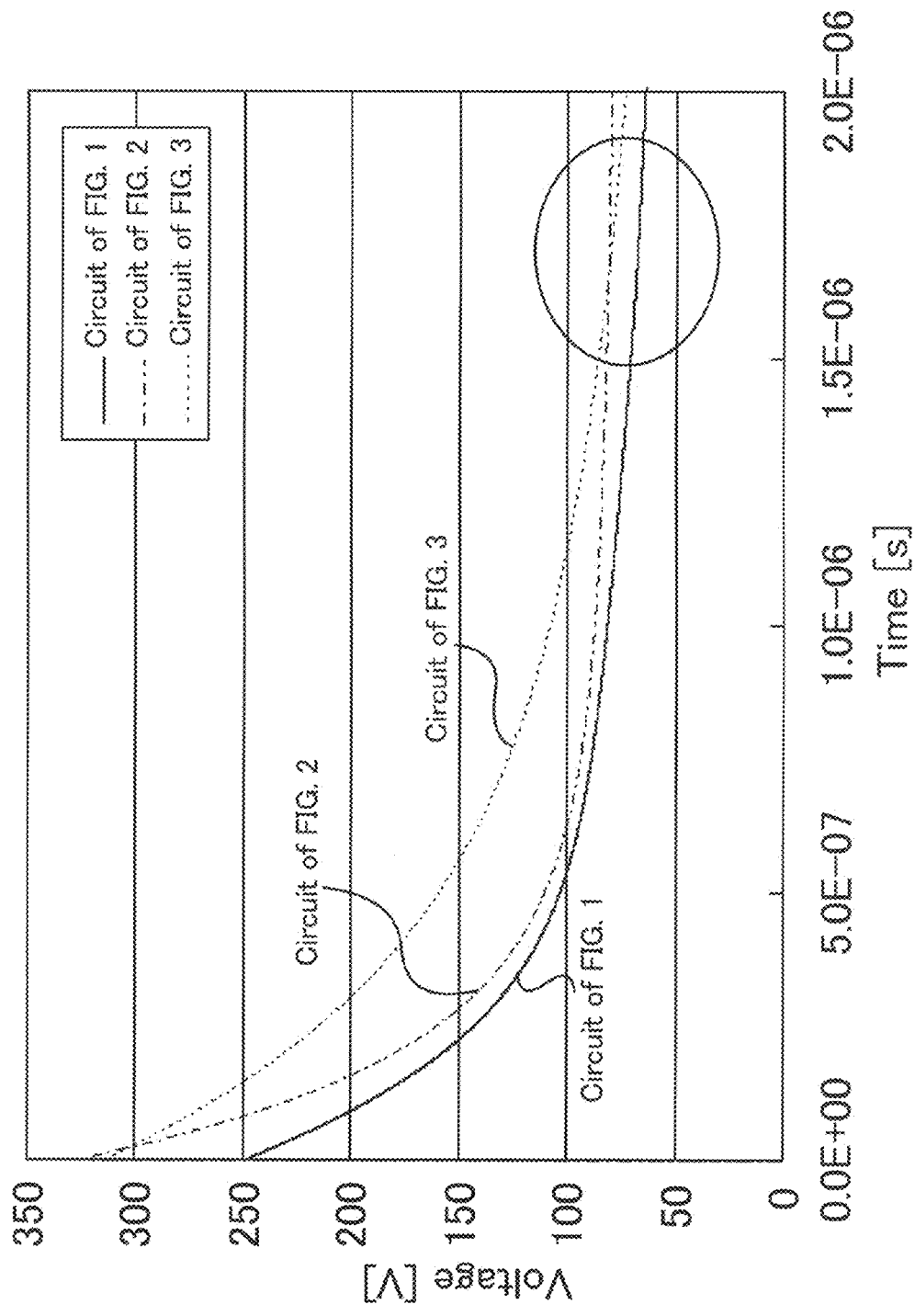
FIG. 13 is a graph showing Example 1.

In order to describe principles of the above protection circuits, tests were performed using a circuit simulator. FIG. 13 is a graph in which potentials at the point of 11 in the circuit of FIG. 1, at the point of 121 in the circuit of FIG. 2, and at the point of 131 in the circuit of FIG. 3 were compared. The graph shows that when the same potential was applied, increase in the potential applied to the SIG terminal was suppressed in the circuit of FIG. 1 as compared to that in the other two circuits. The ESD potential tended to decrease on the lower voltage side in the circuit of FIG. 1 as compared to in the circuit of FIG. 2 for the following reason. A lateral PIN junction diode is less likely to release electric charges due to ESD when the ESD potential is close to breakdown voltage; however, by addition of the diode-connected TFT, the potential is easily decreased. Note that in the diode-connected TFTs 101 and 1301, the thicknesses of gate insulating films were each 30 nm, the channel lengths were each 50 μm, and the channel widths were each 50 μm. The thicknesses of silicon in the lateral PIN junction diodes 102, 103, 1201, 1202, 1301, and 1302 were each 66 nm, and the widths thereof were each 800 μm. The resistance of the Si resistors 104, 1203, and 1303 was 100 kΩ. The breakdown voltage of the lateral PIN junction diodes was set to 80 V.

Example 2

Figure 14:
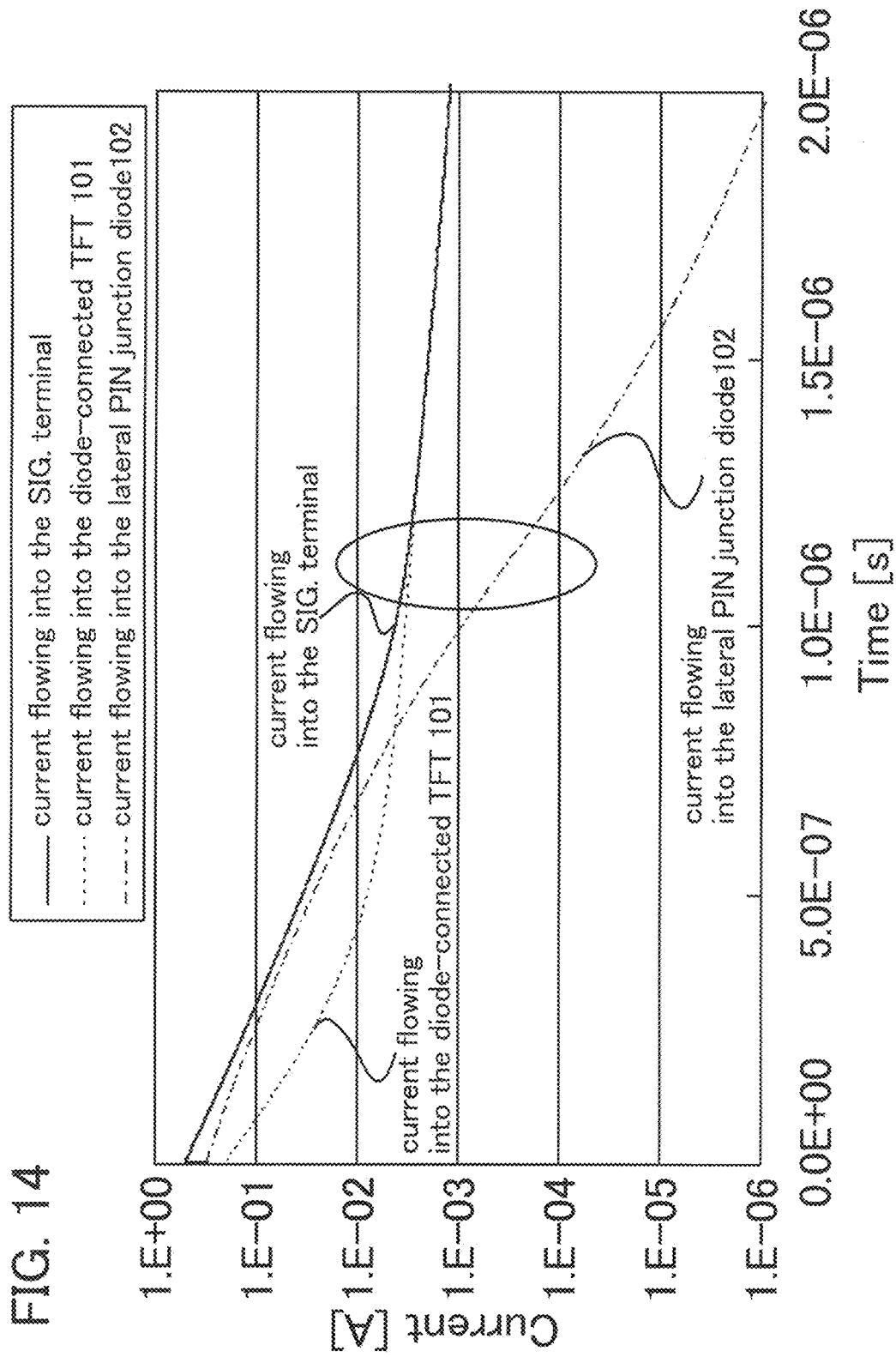
FIG. 14 is a graph showing Example 2.

FIG. 14 shows results of calculating current flowing into the SIG. terminal, current flowing into the lateral PIN junction diode 102, and current flowing into the diode-connected TFT 101 in the circuit of FIG. 1. According to FIG. 14, ESD current was able to be released to a certain degree by the lateral PIN junction diode and the diode-connected TFT; however, as the ESD potential was closer to breakdown voltage of the lateral PIN junction diode, electric charges due to ESD began to be released by only the diode-connected TFT.

Figure 15:
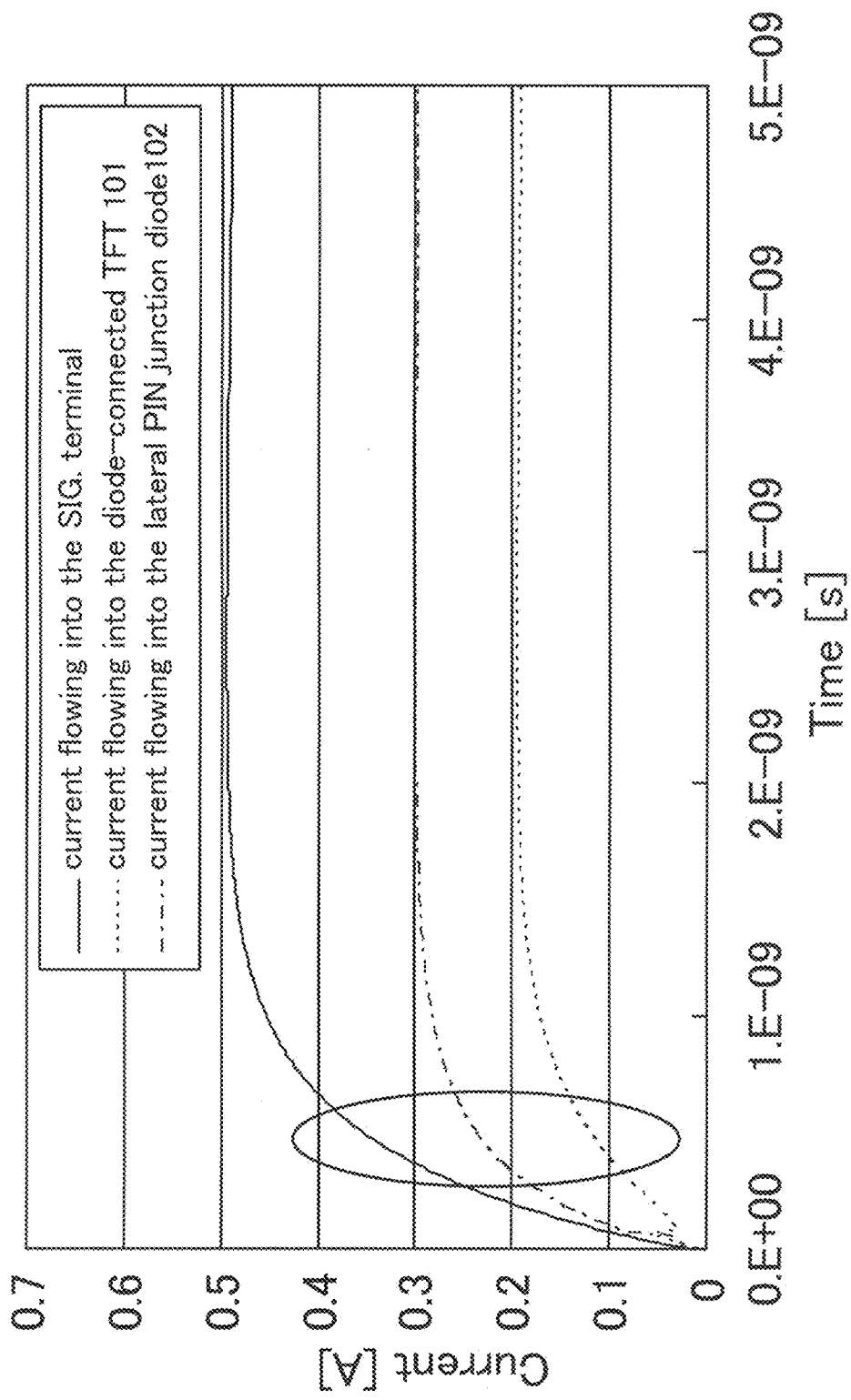
FIG. 15 is a graph showing Example 2.

According to FIG. 15, immediately after application of ESD voltage, the lateral PIN junction diode released electric charges due to ESD more quickly than the diode-connected TFT.

Example 3

Figure 16:
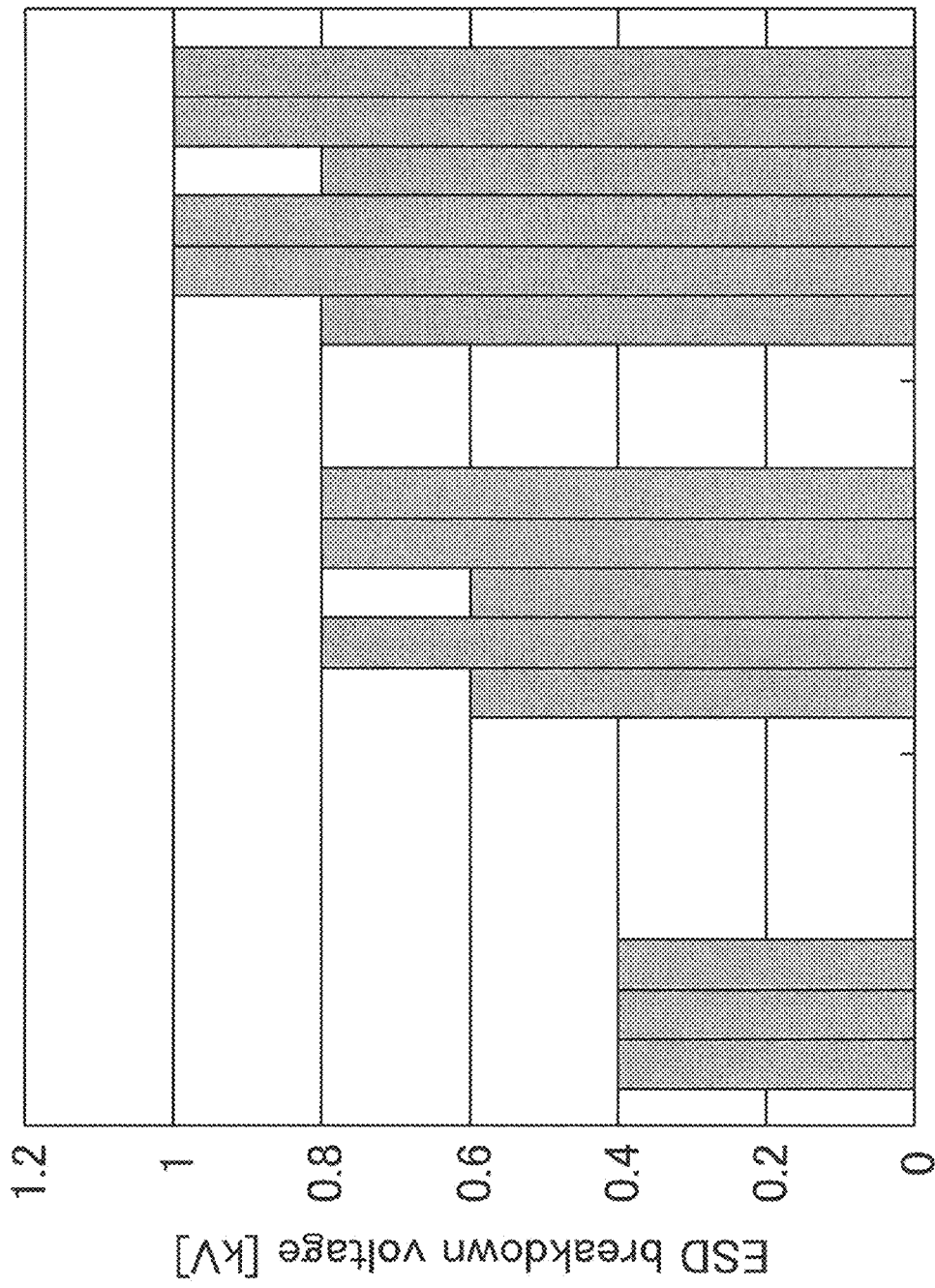
FIG. 16 is a graph showing Example 3.

The circuit in FIG. 1, the circuit in FIG. 2, and the circuit in FIG. 3 were manufactured. FIG. 16 shows results of applying a high potential to the SIG. terminals of the respective circuits. As compared to the circuit in FIG. 2, the circuit in FIG. 1 and the circuit in FIG. 3 had high ESD breakdown voltage.

With a circuit according to one mode of the present invention, increase in the ESD potential can be suppressed by a lateral PIN junction diode and probability of breakdown of a gate insulating film in a diode-connected TFT can be suppressed. In addition, the diode-connected TFT can release electric charges due to low-potential ESD, which the lateral PIN junction diode is less likely to release.

The present invention is not limited to the above description, and it is easily understood by those skilled in the art that the mode and detail of the present invention can be variously changed without departing from the spirit and scope of the present invention. Therefore, the present invention should not be interpreted as being limited to the description in the above embodiments.

This application is based on Japanese Patent Application serial no. 2009-027573 filed with Japanese Patent Office on Feb. 9, 2009, the entire contents of which are hereby incorporated by reference.

What is claimed is:

1. A protection circuit comprising:
a first diode between a signal line and a first power supply line;
a second diode between the signal line and the first power supply line in parallel to the first diode; and
a third diode between the first power supply line and a second power supply line,
wherein the first diode is a diode-connected transistor,
wherein the second diode has a PIN junction or a PN junction,
wherein each of the first diode and the second diode is electrically connected to the signal line and the first power supply line such that a reverse bias is applied to each of the first diode and the second diode when a potential of the signal line is higher than a potential of the first power supply line,
wherein a channel length of the first diode is 2 μm to 6 μm, and
wherein a channel width of the first diode is 3000 μm to 4000 μm.

2. The protection circuit according to claim 1, wherein the first diode is formed at the same time as at least one of transistors included in an integrated circuit electrically connected to the signal line.

3. The protection circuit according to claim 1,
wherein the second diode is a lateral junction diode having the PIN junction or the PN junction which is formed by adding an impurity imparting p-type conductivity and an impurity imparting n-type conductivity to a semiconductor layer, and
wherein the semiconductor layer is formed at the same time as a semiconductor layer of the first diode.

4. The protection circuit according to claim 3, wherein the semiconductor layer and the semiconductor layer of the first diode are oxide semiconductor layers.

5. The protection circuit according to claim 1, wherein the signal line includes a resistor that is provided in series in any path which is electrically connected to an integrated circuit.

6. A semiconductor device comprising the protection circuit according to claim 1.

7. A photoelectric conversion device comprising the semiconductor device according to claim 6.

8. An electronic device comprising the semiconductor device according to claim 6.

9. The protection circuit according to claim 1, wherein a transistor in an integrated circuit comprises an oxide semiconductor layer comprising at least one of indium (In), gallium (Ga), zinc (Zn), and tin (Sn).

10. A protection circuit comprising:
a thin film transistor between a signal line and a first power supply line;
a first diode between the signal line and the first power supply line in parallel to the thin film transistor; and
a second diode between the first power supply line and a second power supply line,
wherein one of source and drain regions of the thin film transistor is connected to the signal line, the other one of the source and drain regions is connected to the first power supply line, and a gate of the thin film transistor is connected to one of the source and drain regions,
wherein the first diode has a PIN junction or a PN junction,
wherein each of the thin film transistor and the first diode is electrically connected to the signal line and the first power supply line such that a reverse bias is applied to each of the thin film transistor and the first diode when a potential of the signal line is higher than a potential of the first power supply line,
wherein a channel length of the thin film transistor is 2 μm to 6 μm, and
wherein a channel width of the thin film transistor is 3000 μm to 4000 μm.

11. The protection circuit according to claim 10, wherein the thin film transistor is formed at the same time as at least one of transistors included in an integrated circuit electrically connected to the signal line.

12. The protection circuit according to claim 10,
wherein the first diode is a lateral junction diode having the PIN junction or the PN junction which is formed by adding an impurity imparting p-type conductivity and an impurity imparting n-type conductivity to a semiconductor layer, and
wherein the semiconductor layer is formed at the same time as a semiconductor layer of the thin film transistor.

13. The protection circuit according to claim 12, wherein the semiconductor layer and the semiconductor layer of the thin film transistor are oxide semiconductor layers.

14. The protection circuit according to claim 10, wherein the signal line includes a resistor that is provided in series in any path which is electrically connected to an integrated circuit.

15. A semiconductor device comprising the protection circuit according to claim 10.

16. A photoelectric conversion device comprising the semiconductor device according to claim 15.

17. An electronic device comprising the semiconductor device according to claim 15.

18. The protection circuit according to claim 10, wherein a transistor in an integrated circuit comprises an oxide semiconductor layer comprising at least one of indium (In), gallium (Ga), zinc (Zn), and tin (Sn).

* * * * *